(12) United States Patent
Lee et al.

(10) Patent No.: US 10,133,174 B2
(45) Date of Patent: Nov. 20, 2018

(54) LIQUID PHOTOREACTIVE COMPOSITION AND METHOD OF FABRICATING STRUCTURES

(71) Applicant: 3M INNOVATIVE PROPERTIES COMPANY, St. Paul, MN (US)

(72) Inventors: Tzu-Chen Lee, Woodbury, MN (US); Robert J. DeVoe, Minnetonka, MN (US); Brian K. Nelson, Shoreview, MN (US); Brian J. Gates, Osceola, WI (US)

(73) Assignee: 3M Innovative Properties Company, St. Paul, MN (US)

( * ) Notice: Subject to any disclaimer, the term of this patent is extended or adjusted under 35 U.S.C. 154(b) by 30 days.

(21) Appl. No.: 15/100,577

(22) PCT Filed: Dec. 1, 2014

(86) PCT No.: PCT/US2014/067955
§ 371 (c)(1),
(2) Date: May 31, 2016

(87) PCT Pub. No.: WO2015/084735
PCT Pub. Date: Jun. 11, 2015

(65) Prior Publication Data
US 2016/0306277 A1 Oct. 20, 2016

Related U.S. Application Data

(60) Provisional application No. 61/912,754, filed on Dec. 6, 2013.

(51) Int. Cl.
| | |
|---|---|
| *G03F 7/00* | (2006.01) |
| *G03F 7/039* | (2006.01) |
| *G03F 7/16* | (2006.01) |
| *G03F 7/20* | (2006.01) |
| *G03F 7/30* | (2006.01) |
| *C08F 2/50* | (2006.01) |
| *G03F 7/027* | (2006.01) |
| *G03F 7/031* | (2006.01) |
| *G03F 7/038* | (2006.01) |
| *C08F 222/10* | (2006.01) |

(52) U.S. Cl.
CPC .............. *G03F 7/0037* (2013.01); *C08F 2/50* (2013.01); *G03F 7/027* (2013.01); *G03F 7/031* (2013.01); *G03F 7/038* (2013.01); *G03F 7/039* (2013.01); *G03F 7/16* (2013.01); *G03F 7/20* (2013.01); *G03F 7/2012* (2013.01); *G03F 7/2053* (2013.01); *G03F 7/30* (2013.01); *C08F 2222/1026* (2013.01)

(58) Field of Classification Search
CPC ......... C07C 57/58; C07C 63/70; C07C 65/03; C07C 233/54; C07C 271/28; C07C 309/66; C07C 381/12; C07C 2603/74; C07C 2603/68; C07C 2602/28; C07C 2601/18; C07D 333/76; C07D 279/20; C07D 327/08; G03F 7/0382; G03F 7/38; G03F 7/322; G03F 7/2037; G03F 7/0045; G03F 7/0046; G03F 7/0048; G03F 7/325; G03F 7/0392; G03F 7/162; G03F 7/168; G03F 7/2004; G03F 7/2006
USPC ....................................................... 430/208.1
See application file for complete search history.

(56) References Cited

U.S. PATENT DOCUMENTS

| | | | |
|---|---|---|---|
| 3,729,313 A | 4/1973 | Smith | |
| 3,741,769 A | 6/1973 | Smith | |
| 3,808,006 A | 4/1974 | Smith | |
| 4,250,053 A | 2/1981 | Smith | |
| 4,394,403 A | 7/1983 | Smith | |
| 4,859,572 A | 8/1989 | Farid | |
| 5,545,676 A | 8/1996 | Palazzotto | |
| 5,770,737 A | 6/1998 | Reinhardt | |

(Continued)

FOREIGN PATENT DOCUMENTS

| | | |
|---|---|---|
| CN | 102105108 A | 6/2011 |
| JP | 2012/047787 A | 3/2012 |

(Continued)

OTHER PUBLICATIONS

English translation of JP 2012-047787 a generated on Sep. 26, 2018. (Year: 2018).*

(Continued)

*Primary Examiner* — Cynthia Hamilton
(74) *Attorney, Agent, or Firm* — Bradford B. Wright

(57) ABSTRACT

A method of fabricating a structure includes disposing a liquid photoreactive composition on a substrate, exposing a portion of the liquid photoreactive composition to laser light of sufficient intensity and wavelength to cause polymerization via two-photon excitation of the two-photon sensitizer and polymerization of a portion of the liquid photoreactive composition thereby providing an exposed composition; and developing the exposed composition to provide the structure. The liquid composition includes: at least one cationically polymerizable polyepoxide; at least one compound comprising free-radically polymerizable groups; an effective amount of a two-photon photoinitiator system, wherein the weight ratio of component (a) to component (b) is from 25:75 to 75:25, inclusive. The two-photon photoinitiator system includes a two-photon sensitizer and an aromatic onium salt. The liquid photoreactive composition may contain less than about one percent by weight of organic solvent.

26 Claims, 4 Drawing Sheets

(56) References Cited

U.S. PATENT DOCUMENTS

| | | | |
|---|---|---|---|
| 5,859,251 | A | 1/1999 | Reinhardt |
| 6,025,406 | A | 1/2000 | Oxman |
| 6,100,405 | A | 8/2000 | Reinhardt |
| 6,750,266 | B2 | 6/2004 | Bentsen |
| 6,852,766 | B1 | 2/2005 | Devoe |
| 6,855,478 | B2 | 2/2005 | Devoe |
| 7,005,229 | B2 | 2/2006 | Nirmal |
| 7,014,988 | B2 | 3/2006 | Devoe |
| 7,060,419 | B2 | 6/2006 | Bentsen |
| 7,091,255 | B2 | 8/2006 | Devoe |
| 7,118,845 | B2 | 10/2006 | Devoe |
| 7,166,409 | B2 | 1/2007 | Fleming |
| 7,232,650 | B2 | 6/2007 | Leatherdale |
| 7,265,161 | B2 | 9/2007 | Leatherdale |
| 7,338,747 | B2 | 3/2008 | Song |
| 7,381,516 | B2 | 6/2008 | Arney |
| 7,790,347 | B2 | 9/2010 | Leatherdale |
| 7,790,353 | B2 | 9/2010 | Fleming |
| 7,803,514 | B2 | 9/2010 | Park |
| 7,893,410 | B2 | 2/2011 | Sykora |
| 7,936,956 | B2 | 5/2011 | Marttila |
| 7,941,013 | B2 | 5/2011 | Marttila |
| 7,964,248 | B2 | 6/2011 | Fong |
| 8,004,767 | B2 | 8/2011 | Devoe |
| 8,227,048 | B2 | 7/2012 | Leyden |
| 8,322,874 | B2 | 12/2012 | Ender |
| 8,377,623 | B2 | 2/2013 | Fong |
| 8,530,118 | B2 | 9/2013 | Devoe |
| 8,545,037 | B2 | 10/2013 | Ender |
| 2002/0034711 | A1 | 3/2002 | Xu et al. |
| 2003/0155667 | A1 | 8/2003 | Devoe |
| 2004/0012872 | A1 | 1/2004 | Fleming |
| 2004/0042937 | A1 | 3/2004 | Bentsen |
| 2004/0126694 | A1 | 7/2004 | Devoe |
| 2004/0223385 | A1 | 11/2004 | Fleming |
| 2005/0054744 | A1 | 3/2005 | Devoe |
| 2005/0124712 | A1 | 6/2005 | Anderson |
| 2007/0264501 | A1 | 11/2007 | Leatherdale |
| 2007/0282030 | A1 | 12/2007 | Anderson |
| 2009/0035528 | A1 | 2/2009 | Leatherdale |
| 2009/0099537 | A1 | 4/2009 | Devoe |
| 2010/0227272 | A1 | 9/2010 | Devoe |
| 2010/0239783 | A1 | 9/2010 | Mao |
| 2010/0308509 | A1 | 12/2010 | David |
| 2010/0316959 | A1 | 12/2010 | Gates |
| 2011/0121486 | A1* | 5/2011 | Oh ................. A61B 17/205 264/225 |
| 2011/0269865 | A1 | 11/2011 | Wu |
| 2012/0126038 | A1 | 5/2012 | Carpenter |
| 2012/0218535 | A1 | 8/2012 | Thiel |
| 2016/0299426 | A1 | 10/2016 | Gates et al. |

FOREIGN PATENT DOCUMENTS

| | | |
|---|---|---|
| WO | WO 1998-21521 | 5/1998 |
| WO | WO 1999-53242 | 10/1999 |
| WO | WO 2001-96409 | 12/2001 |
| WO | WO 2002-079691 | 10/2002 |
| WO | WO 2007-112309 | 10/2007 |
| WO | 2012/026298 A1 | 3/2012 |
| WO | WO 2012-145282 | 10/2012 |

OTHER PUBLICATIONS

Abstract From Scifinder Database for JP 2012-047787A on Sep. 26, 2018. (Year: 2018).*

Beringer, "Diaryliodonium Salts. IX. The Synthesis of Substituted Diphenyliodonium Salts", Journal of the American Chemical Society, Jan. 1959, vol. 81, pp. 342-351.

Beringer, "Diaryliodonium Salts. X. Catalysts and Inhibitors in the Reactions of Diphenyliodonium Ions with Anions and Hydroxylic Solvents", Journal of the American Chemical Society, Jan. 1959, vol. 81, pp. 351-361.

Demas, "The Measurement of Photoluminescence Quantum Yields", Journal of Physical Chemistry, Apr. 1971, vol. 75, No. 8, pp. 991-1024.

Morris, "Fluorescence Quantum Yield Determinations. 9,10-Diphenylanthracene as a Reference Standard indifferent Solvents", Journal of Physical Chemistry, 1976, vol. 80, No. 9, pp. 969-974.

Newport, "Three Dimensional Microfabrication by Two-Proton Polymerization", 2008, 10 pgs.

Xu, "Measurement of two-photon excitation cross sections of molecular fluororphores with data from 690 to 1050 nm" Journal of Optical Society of America B, Mar. 1996, vol. 13, No. 3, pp. 481-491.

International Search Report for PCT International Application No. PCT/US2014/067955, dated Jun. 26, 2015, 3 pgs.

* cited by examiner

LIQUID PHOTOREACTIVE COMPOSITION AND METHOD OF FABRICATING STRUCTURES

TECHNICAL FIELD

The present disclosure relates to compositions and processes for multiphoton-induced polymerization resulting in fabrication of three-dimensional objects.

BACKGROUND

Multiphoton photochemical processes generally involve the simultaneous absorption of two or more photons by an absorbing chromophore. In such processes, the chromophore typically does not absorb at the wavelength of the individual photons, but at sufficiently high intensity a simultaneous absorption of multiple photons by the chromophore occurs. For example, simultaneous absorption of two photons having a wavelength $\lambda$ has the effect of absorption of a single photon of wavelength $\lambda/2$. While single-photon absorption generally scales linearly with the intensity of the incident radiation two-photon absorption scales quadratically, and higher-order absorptions scale with a corresponding higher-order power of the intensity of the incident radiation. As a result, it is typically possible to perform multiphoton curing processes with three-dimensional spatial resolution. Furthermore, since the incident radiation is not attenuated by single-photon absorption within a photoreactive (e.g., polymerizable) material, it is generally possible to selectively excite molecules at a greater depth within the material than would be possible via single-photon excitation. In multiphoton imaging processes, a layer of unexposed photoreactive material disposed on a substrate is commonly referred to as a "photoresist".

Multiphoton-induced photopolymerization, typically using a femtosecond pulsed laser (e.g., an infrared laser), has been used to fabricate three-dimensional devices with sub-micron resolution. Multiphoton fabrication has been used to manufacture mechanical and optical devices, such as cantilevers, gears, shafts, and microlenses.

In typical multiphoton imaging processes, exposed regions of a photoresist crosslink and harden. Solvent development removes unexposed (non-polymerized) regions of the photoresist, leaving behind an imaged three-dimensional structure. Depending on the particular photoresist, this development step may lead to distortion of the three-dimensional structure.

A common method used in the art of multiphoton microfabrication utilizes a solvent cast solid polymerizable composition (sometimes referred to as a "photoresist"). Imaging such solid polymerizable compositions is complicated by either: 1) the existence of an air interface between the photoresist and the optics used to focus the laser beam; or the presence of an index matching fluid sandwiched between the optics and the surface of the photoresist.

In practice, the resolution achieved in multiphoton fabrication processes is typically dependent on the size and shape of voxels (i.e., volumetric pixels). In the case of multiphoton-induced reaction of a photoreactive material, the term "voxel" refers to the smallest volume element of reacted photoreactive material that is generated by the multiphoton induced reaction.

By repetition of the voxel, three-dimensional objects may be constructed in analogous manner to the way a two-dimensional object is constructed from pixels. The maximum resolution of a three-dimensional object manufactured in this way is generally limited by the size and shape of the voxel. In addition to voxel shape, the overall volumetric polymerization rate of multiphoton fabrication processes are important for them to be useful in a practical (e.g., commercial) setting where rapid throughput is desirable.

There is a continuing need for materials and methods suitable for use in multiphoton imaging processes that can be used to fabricate sub-micron three-dimensional features.

SUMMARY

In one aspect, the present disclosure provides a method of fabricating a structure, the method comprising steps:
 (i) disposing a liquid photoreactive composition on a substrate, wherein the liquid photoreactive composition comprises components:
  (a) at least one cationically polymerizable aliphatic epoxide having an epoxy group functionality of 2;
  (b) at least one free-radically polymerizable compound having a free-radically polymerizable group functionality of 3; and
  (c) an effective amount of a two-photon photoinitiator system comprising:
   a two-photon sensitizer; and
   an aromatic onium salt,
  wherein component (a) and component (b) are present in a respective weight ratio of from 25:75 to 75:25, inclusive; and
 (ii) exposing a portion of the liquid photoreactive composition to laser light of sufficient intensity and wavelength to cause polymerization via two-photon excitation of the two-photon sensitizer and polymerization of a portion of the composition thereby providing an exposed composition; and
 (iii) developing the exposed composition to provide the structure.

In some embodiments, steps (i), (ii), and (iii) are consecutive; however, this is not a requirement.

In another aspect, the present disclosure provides a liquid photoreactive composition, wherein the liquid photoreactive composition comprises components:
 (a) at least one cationically polymerizable polyepoxide;
 (b) at least one compound comprising free-radically polymerizable groups; and
 (c) an effective amount of a two-photon photoinitiator system comprising:
  a two-photon sensitizer; and
  an aromatic onium salt,
 wherein the liquid photoreactive composition contains less than one percent by weight of organic solvent, and wherein component (a) and component (b) are present in a respective weight ratio of from 25:75 to 75:25, inclusive.

Advantageously, methods according to the present disclosure are highly-sensitive and capable of forming superior three-dimensional articles by multiphoton polymerization.

During careful investigation of the effect of solvent in multiphoton fabrication processes, the present investigators identified that a primary cause of dimensional distortion was residual solvent that was present in the liquid photoreactive composition during writing. Accordingly, in preferred embodiments, the liquid photoreactive composition contains little or no added solvent. In such embodiments, little or no dimensional distortion (e.g., shrinkage, erosion, and/or slumping, or positional errors from refractive index effects) of the fabricated structure results during developing.

The liquid photoreactive composition does not need to be dried before writing. It can be written both with an air objective lens and an immersion-objective lens (yielding higher resolution). It is also highly photosensitive, evidenced by the required energy dose to cure, which is about one tenth of that required by the typical acrylate stock resist.

In addition, use of liquid photoreactive composition with the approach of immersing a protected, high numerical aperture (NA) objective lens assembly in the liquid photoreactive composition enables fabrication of microstructures that are taller than the working distance of the objective used in the exposure while maintaining the small spot size of the high NA objective lens assembly. Additionally, solvent-cast solid photoreactive compositions with residual solvent will have varying refractive indices, which lead to variation in structure dimensions during writing. Drying of solvent-cast photoresists can require days to drive off all residual solvent, whereas the present liquid photoreactive composition can be used immediately. Solvent-cast solid photoreactive compositions also are difficult to coat onto non-flat substrates, and can cause optical problems at material/air or material/index matching fluid interface. As used herein:

"acryl" refers to the group

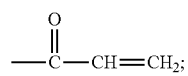

"methacryl" refers to the group

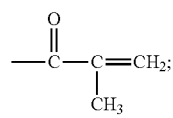

"(meth)acryl" refers to acryl and/or methacryl;

"cure" means to effect polymerization and/or to effect crosslinking;

"final optical element" means the last light focusing optical element, or combination of optical elements, in an optical system that focuses light leaving the optical system;

"free-radically polymerizable polyfunctional (meth)acrylate" refers to a compound having more than one (meth)acryloxy group;

"light" means electromagnetic radiation having a wavelength in a range of from about 300 to about 1500 nm;

"liquid" refers to a compound that is in a liquid state at one atmosphere of pressure and at least one temperature in the range of from 20-25° C., inclusive; and "multiphoton absorption" means the simultaneous absorption of two or more photons of light to reach a photoreactive, electronic excited state that is energetically inaccessible by the absorption of a single photon of the same energy;

"multiphoton absorber" means a specie capable of undergoing multiphoton absorption of light;

"numeric aperture" means the product of the index of refraction of the object medium multiplied by the sine of the slope angle of the outermost ray from an axial point on the object;

"optical system" means a system for controlling light, including at least one element chosen from refractive optical elements such as lenses (including microlens arrays), reflective optical elements such as mirrors, and diffractive optical elements (including gratings). Optical elements shall also include diffusers, waveguides, and other elements known in the optical arts;

the term "polyepoxide" refers to a compound containing at least two epoxide rings.

"photochemically effective amount" means an amount sufficient to enable the photoreactive species to undergo at least partial reaction under the selected exposure conditions (as evidenced, e.g., by a change in density, viscosity, color, pH, refractive index, or other physical or chemical property);

"simultaneous" means two events that occur within the period of $10^{-14}$ seconds or less; and "solvent" refers to a nonreactive liquid component of a composition that dissolves at least one solid component, or dilutes at least one liquid component, of the composition (in the case of water, adventitious amounts of water are not included by the term "solvent");

"solvent developing" means substantially removing (e.g., dissolving) soluble material in a solvent while substantially not removing insoluble material.

In the specification and drawings, the following chemical abbreviations are used: Me=methyl, Et=ethyl, Ph=phenyl, Bu=n-butyl, Features and advantages of the present disclosure will be further understood upon consideration of the detailed description as well as the appended claims.

It should be understood that numerous other modifications and embodiments can be devised by those skilled in the art, which fall within the scope and spirit of the principles of the disclosure. The figures may not be drawn to scale.

DETAILED DESCRIPTION

In practice of the present disclosure, a liquid photoreactive composition is exposed to light under conditions such that multiphoton absorption occurs, thereby causing a region of differential solubility (e.g., lesser or greater solubility) as compared to the photoreactive composition prior to exposure. Such exposure may be accomplished by any known means capable of achieving sufficient intensity of the light.

Figure 1:
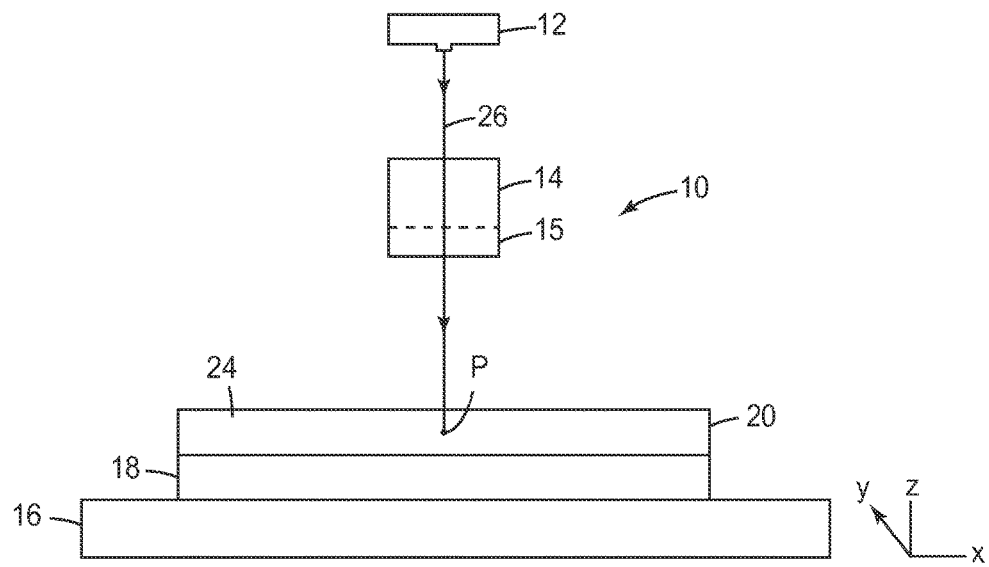
FIG. 1 is a schematic representation of an exemplary multiphoton fabrication system useful for practicing the present disclosure.

One exemplary type of system that may be used to practice the present disclosure is shown in FIG. 1. Referring to FIG. 1, fabrication system 10 includes light source 12, optical system 14 comprising a final optical element 15, and moveable stage 16. Stage 16 is moveable in one, two, or more typically three dimensions. Substrate 18 mounted on stage 16 has a layer 20 of photoreactive composition 24 thereon. Light beam 26 originating from light source 12 passes through optical system 14 and leaves through final optical element 15 which focuses it to a point P within layer 20, thereby controlling the three-dimensional spatial distribution of light intensity within the composition and causing at least a portion of photoreactive composition 24 in the vicinity of point P to become less (or less commonly more) soluble in at least one solvent than it was immediately prior to exposure to light beam 26. By moving stage 16, or by directing light beam 26 (e.g., moving a laser beam using galvo-mirrors) in combination with moving one or more elements of optical system 14, the focal point P can be scanned or translated in a three-dimensional pattern that corresponds to a desired shape. For example, stage 16 can be moved in x and y dimensions and final optical element 15 moved in the z dimension to control the position of point P. The photoreacted or partially photoreacted portion of the photoreactive composition 24 then creates a three-dimensional structure of a desired shape.

Light source 12 can be any light source that produces sufficient light intensity to effect multiphoton absorption. Suitable sources include, for example, femtosecond near-infrared titanium sapphire oscillators (e.g., as available from Coherent, Santa Clara, Calif. under the trade designation "MIRA OPTIMA 900-F") pumped by an argon ion laser (e.g., those available from Coherent under the trade designation "INNOVA"). This laser, operating at 76 MHz, has a pulse width of less than 200 femtoseconds, is tunable between 700 and 980 nm, and has average power up to 1.4 Watts. Another useful laser is available from Spectra-Physics, Mountain View, Calif., under the trade designation "MAI TAI", tunable to wavelengths in a range of from 750 to 850 nanometers, and having a repetition frequency of 80 megahertz, and a pulse width of about 100 femtoseconds, with a power level up to 1 Watt.

However, any light source (e.g., a laser) that provides sufficient intensity to induce multiphoton absorption at a wavelength appropriate for the multiphoton absorber used in the photoreactive composition can be used. Such wavelengths can generally be in the range of about 300 to about 1500 nanometers (nm); preferably, from about 400 to about 1100 nm; more preferably, from about 600 to about 900 nm; and even more preferably from about 750 to about 850 nm, inclusive. Typically, the light fluence (e.g., peak intensity of a pulsed laser) is greater than about 106 watts per square centimeter ($W/cm^2$). The upper limit on the light fluence is generally dictated by the ablation threshold of the photoreactive composition. For example, Q-switched Nd:YAG lasers (e.g., those available from Spectra-Physics under the trade designation "QUANTA-RAY PRO"), visible wavelength dye lasers (e.g., those available from Spectra-Physics under the trade designation "SIRA" pumped by a Q-switched Nd:YAG laser from Spectra-Physics having the trade designation "QUANTA-RAY PRO"), and Q-switched diode pumped lasers (e.g., those available from Spectra-Physics under the trade designation "FCBAR") can also be used.

Preferred light sources are near infrared pulsed lasers having a pulse length less than about $10^{-8}$ second (more preferably less than about $10^{-10}$ second, and still more preferably less than about $2\times10^{-13}$ second). Other pulse lengths can be used as long as the peak intensity and ablation threshold criteria above are met. Pulsed radiation may, for example, have a pulse frequency of from about one kilohertz up to about 80 megahertz, or more. Continuous wave lasers can also be used.

Optical system 14 may include, for example, refractive optical elements (e.g., lenses or microlens arrays), reflective optical elements (e.g., retroreflectors or focusing mirrors), diffractive optical elements (e.g., gratings, phase masks, and holograms), polarizing optical elements (e.g., linear polarizers and waveplates), dispersive optical elements (e.g., prisms and gratings), diffusers, Pockels cells, and waveguides. Such optical elements are useful for focusing, beam delivery, beam/mode shaping, pulse shaping, and pulse timing Generally, combinations of optical elements can be utilized, and other appropriate combinations will be recognized by those skilled in the art. Final optical element 15 may include, for example, one or more refractive, reflective, and/or diffractive optical elements. In preferred embodiments, the final optical element is a microscope objective. Microscope objectives can be conveniently obtained from commercial sources such as, Carl Zeiss Microscopy LLC, Thornwood, N.Y., and used as final optical element 15. For example, fabrication system 10 can include a scanning confocal microscope (e.g., those available from Bio-Rad Laboratories, Hercules, Calif., under the trade designation MRC600) equipped with a 0.75 NA objective (such as, e.g., those available from Carl Zeiss Microscopy LLC as 20X FLUAR).

Preferably, the microscope objective is immersed in the liquid photoreactive composition during use; however, this is not a requirement. If immersed, the microscope objective is preferably protected from contact with the liquid photoreactive composition. Methods for such protection include, for example, protective transparent covers and films.

The numeric aperture of final optical element 15 may have any value in the range of from 0.3 to 1.6, preferably from 0.8 to 1.5, and more preferably from 1.0 to 1.4, inclusive, although other numeric apertures may also be used. Useful air objectives typically have a numeric aperture in a range of from 0.65 to about 0.95. Useful immersion objectives (e.g., oil or water immersion objectives) typically have a numeric aperture in a range of from 0.5 up to 1.45 or even 1.6.

Exposure times generally depend upon the type of exposure system used to cause reaction of the photoreactive species in the liquid photoreactive composition (and its accompanying variables such as numerical aperture, geometry of light intensity spatial distribution, the peak light intensity during the laser pulse (higher intensity and shorter pulse duration roughly correspond to peak light intensity)), as well as upon the nature of the liquid photoreactive composition. Generally, higher peak light intensity in the regions of focus allows shorter exposure times, everything else being equal. Linear imaging or "writing" speeds generally can be about 5 to 500,000 microns/second or more using a laser pulse duration of about $10^{-8}$ to $10^{-15}$ second (e.g., about $10^{-11}$ to $10^{-14}$ second) and about $10^2$ to $10^9$ pulses per second (e.g., about $10^3$ to $10^8$ pulses per second).

In order to successfully solvent develop the exposed photoreactive composition and obtain a fabricated structure, a threshold dose of light (i.e., threshold dose) is typically required. This threshold dose is typically process specific, and may depend on variables such as, for example, the wavelength, pulse frequency, intensity of the light, the specific photoreactive composition, the specific structure being fabricated, or the process used for solvent development. Thus, each set of process parameters is typically characterized by a threshold dose. Higher doses of light than the threshold may be used, and may be beneficial, however higher doses (once above the threshold dose) typically require a slower writing speed and/or higher light intensity. Further, increasing the dose tends to increase the volume and aspect ratio of voxels generated by the process. Thus, in order to obtain voxels of low aspect ratio, it is generally preferable to use a light dose that is less than 10 times the threshold dose, preferably less than 4 times the threshold dose, and more preferably less than 3 times the threshold dose.

Through multiphoton absorption, light beam 26 induces a reaction in the photoreactive composition that produces a volume region of material having solubility characteristics different from those of the unexposed photoreactive composition. The resulting pattern of differential solubility can then be realized by a conventional development process, for example, by removing unexposed regions. The exposed photoreactive composition can be developed, for example, by placing the exposed photoreactive composition into solvent to dissolve regions of higher solvent solubility, rinsing with solvent, evaporation, oxygen plasma etching, or by other known methods, and combinations thereof. Solvents that may be used for developing the exposed photoreactive composition include aqueous solvents such as, for example, water (e.g., having a pH in a range of from 1 to 12) and miscible blends of water with organic solvents (e.g., methanol, ethanol, propanol, acetone, acetonitrile, dimethylformamide, N-methylpyrrolidone, and combinations thereof); and organic solvents. Exemplary useful organic solvents include alcohols (e.g., methanol, ethanol, and propanol), ketones (e.g., acetone, cyclopentanone, and methyl ethyl ketone), aromatics (e.g., toluene), halocarbons (e.g., methylene chloride and chloroform), nitriles (e.g., acetonitrile), esters (e.g., ethyl acetate and propylene glycol methyl ether acetate), ethers (e.g., diethyl ether and tetrahydrofuran), amides (e.g., N-methylpyrrolidone), and combinations thereof.

An optional bake after exposure to light under two-photon absorption conditions, but prior to solvent development, may be useful for some photoreactive compositions such as, for example, epoxy-type photoreactive species. Typical bake conditions include temperatures in a range of from about 40° C. to about 200° C., for times in a range of from about 0.5 minutes to about 20 minutes.

Complex, seamless three-dimensional structures can be prepared in this manner. The resulting structures can have any suitable size and shape, but the method of the disclosure is particularly well suited for adding a microstructure to a surface of an article.

The liquid photoreactive composition comprises: at least one cationically polymerizable aliphatic epoxide having an epoxy group functionality of 2, at least one free-radically polymerizable compound having a free-radically polymerizable group functionality of 3, and a two-photon photoinitiator system. Preferably, these components are selected such that they are free of interfering groups that adversely affect the curing behavior of the liquid photoreactive composition e.g., primary or secondary amines and thiols), although small amounts of such compounds may be acceptable.

Exemplary suitable cationically polymerizable aliphatic epoxides having an epoxy group functionality of 2 include (1-bromo-3,4-epoxycyclohexan-1-yl)methyl 1-bromo-3,4-epoxycyclohexanecarboxylate, (1-chloro-2-methyl-4,5-epoxycyclohexan-1-yl)methyl 1-chloro-2-methyl-4,5-epoxycyclohexanecarboxylate, (1-chloro-3,4-epoxycyclohexan-1-yl)methyl 1-chloro-3,4-epoxycyclohexanecarboxylate, 1,1,1-trimethylolpropane tris(3,4-epoxycyclohexanecarboxylate), 1,2,3-propanetriol tris(3,4-epoxycyclohexanecarboxylate), 1,2-bis (2,3-epoxy-2methylpropoxy)ethane, 1,5-pentanediol bis(3,4-epoxycyclohexanecarboxylate), 1,6-hexanediol bis(3,4-epoxycyclohexanecarboxylate), 2-(3,4-epoxycyclohexyl-5,5-spiro-3,4-epoxy) cyclohexane-meta-dioxane, 2,2'-sulfonyldiethanol bis(3,4-epoxycyclohexanecarboxylate), 2,2-diethyl-1,3-propanediol bis(3,4-e,poxyyclohexanecarboxylate), 2,3-epoxycyclopentyl 2-methylglycidyl ether, 2-butene-1,4-diol bis(3,4-epoxy-6-methylcyclohexanecarboxylate), 2-butene-1,4-diol bis(3,4-epoxycyclohexanecarboxylate), 2-methoxymethyl-2,4-dimethyl-1,5-pentanediol bis(3,4-epoxycyclohexanecarboxylate), 3,4-epoxy-1-methylcyclohexylmethyl 3,4-epoxy-1-methylcyclohexanecarboxylate, 3,4-epoxy-2-methylcyclohexylmethyl 3,4-epoxy-2-methylcyclohexanecarboxylate, 3,4-epoxy-6-methylcyclohexylmethyl 9,10-epoxy-stearate, 3,4-epoxycyclohexylmethyl 3,4-epoxycyclohexanecarboxylate, 3,9-bis(3,4-epoxycyclohexyl) spirobi(m-dioxane), bis(2,3-epoxycyclopentyl) ether, bis(3,4-epoxcyclohexylmethyl) oxalate, bis(3,4-epoxy-6-methylcyclohexylmethyl) adipate, bis(3,4-epoxy-6-methylcyclohexylmethyl) diethylene glycol ether, bis(3,4-epoxy-6-methylcyclohexylmethyl) maleate, bis(3,4-epoxy-6-methylcyclohexylmethyl) sebacate, bis(3,4-epoxy-6-methylcyclohexylmethyl) succinate, bis(3,4-epoxy-6-methylcyclohexylmethyl) terephthalate, bis (3,4-epoxycyclohexylmethyl) pimelate, bis(3,4-epoxycyclohexylmethyl) terephthalate, di(3,4-epoxycyclohexylmethyl) 1,3-tolylenedicarbamate, dicyclopentadiene dioxide, diethylene glycol bis(3,4-epoxy-6-methylcyclohexanecarboxylate), diglycidyl ether of cyclohexanedimethanol, diglycidyl ether of neopentyl glycol, dipropylene glycol bis(2-ethylhexyl 4,5-epoxycyclohexane-1,2-dicarboxylate), ethylene glycol bis(3,4-epoxycyclohexanecarboxylate), glycidyl 2,3-epoxycyclopentyl ether, N,N'-ethylene bis(4,5-epoxycyclohexane-1,2-dicarboximide), triethylene glycol bis(3,4-epoxycyclohexane-carboxylate, and vinyl cyclohexene dioxide. Combinations of cationically polymerizable aliphatic epoxides having an epoxy group functionality of 2 can also be used.

Exemplary suitable free-radically polymerizable compounds having a free-radically polymerizable group functionality of 3 include trifunctional (meth)acrylates such as trimethylolpropane tri(meth)acrylate, 1,2,4-butanetriol tri (meth)acrylate, pentaerythritol tri(meth)acrylate, tris(hydroxyethyl) isocyanurate tri(meth)acrylate, glycerol tri (meth)acrylate, ethoxylated (3) trimethylolpropane tri(meth) acrylate, ethoxylated (15) trimethylolpropane tri(meth) acrylate, ethoxylated (6) trimethylolpropane tri(meth) acrylate, ethoxylated (9) trimethylolpropane tri(meth) acrylate, ethoxylated (20) trimethylolpropane tri(meth) acrylate; propoxylated (5.5) glyceryl tri(meth)acrylate, ethoxylated trimethylolpropane tri(meth)acrylate, propoxylated (3) glyceryl tri(meth)acrylate, propoxylated (3) trimethylolpropane triacrylate, propoxylated (6) trimethylolpropane triacrylate, trivinylbenzene, and triallyl isocyanurate. Preferably, the free-radically polymerizable compounds having a free-radically polymerizable group functionality of 3 are liquids. Combinations of free-radically polymerizable compounds having a free-radically polymerizable group functionality of 3 may be used.

Additional epoxy compounds and free-radically polymerizable compounds of other functionality may be also included in the liquid photoreactive composition. For example, in some embodiments, the liquid photoreactive composition may further comprise at least one cationically polymerizable aliphatic epoxide having an epoxy group functionality other than 2. In such embodiments, the average (i.e., number average) cationically polymerizable aliphatic epoxide functionality is preferably in a range of from 1.8 to 2.2, more preferably 1.9 to 2.1, although this is not a requirement.

Alternatively, or in addition, in some embodiments, the liquid photoreactive composition may further comprise at least one free-radically polymerizable compound having a free-radically polymerizable group functionality other than 3. In such embodiments, the average (i.e., number average)

free-radically polymerizable group functionality is preferably in a range of from 2.8 to 3.2, more preferably 2.9, to 3.1, although this is not a requirement.

Examples of cationically polymerizable aliphatic epoxide having an epoxy group functionality other than 2 include: vinylcyclohexene monoxide; 3,4-epoxycyclohexylmethyl acrylate; 2,3-epoxycyclopentyl acrylate; 2,3-epoxycyclopentyl 2-cyclopentenyl ether; 2,3-epoxycyclopentyl crotonate; allyl 2,3-epoxycyclopentyl ether 2,3-epoxycyclopentyl cyclopentyl ether; 2,3-epoxycyclopentyl phenyl ether; 2,3-epoxycyclopentanol; dicyclopentadiene monoxide; styrene oxide; glycidol; glycidyl (meth)acrylate; vinylcyclohexene dioxide; trimethylolethane triglycidyl ether; trimethylolpropane triglycidyl ether; alkylene oxides (e.g., propylene oxide); styrene oxide; alkenyl oxides (e.g., butadiene oxide); and ethyl glycidate. Combinations of cationically polymerizable epoxy compounds can also be utilized.

Examples of suitable free-radically polymerizable compounds having a free-radically polymerizable group functionality other than 3 include: (meth)acrylates such as methyl (meth)acrylate, ethyl (meth)acrylate, isobornyl (meth)acrylate, isopropyl (meth)acrylate, n-hexyl (meth) acrylate, stearyl (meth)acrylate, allyl (meth)acrylate, glycerol di(meth)acrylate, ethylene glycol di(meth)acrylate, 1,3-propanediol di(meth)acrylate, 1,4-cyclohexanediol di(meth) acrylate, pentaerythritol tetra(meth)acrylate, sorbitol hexa (meth)acrylate, 1,12-dodecanediol di(meth)acrylate, 1,3-butylene glycol di(meth)acrylate, 1,4-butanediol di(meth) acrylate, 1,6-hexanediol di(meth)acrylate, 1,4-cyclohexanedimethanol di(meth)acrylate, diethylene glycol di(meth)acrylate, dipropylene glycol di(meth)acrylate, ethoxylated (2) bisphenol A di(meth)acrylate, ethoxylated (3) bisphenol A di(meth)acrylate, ethoxylated (4) bisphenol A di(meth)acrylate, ethoxylated (6) bisphenol A di(meth) acrylate, ethoxylated (8) bisphenol A di(meth)acrylate, ethoxylated (10) bisphenol A di(meth)acrylate, ethoxylated (30) bisphenol A di(meth)acrylate, neopentyl glycol di(meth)acrylate, polyethylene glycol (200) di(meth)acrylate, polyethylene glycol (400) di(meth)acrylate, polyethylene glycol (600) di(meth)acrylate, polyethylene glycol di(meth) acrylate, polypropylene glycol (400) di(meth)acrylate, propoxylated (2) neopentyl glycol di(meth)acrylate, propoxylated neopentyl glycol di(meth)acrylate, tetraethylene glycol di(meth)acrylate, tricyclodecanedimethanol di(meth)acrylate, triethylene glycol di(meth)acrylate, and tripropylene glycol di(meth)acrylate; unsaturated amides such as methylene bis[(meth)acrylamide], 1,6-hexamethylene bis[(meth)acrylamide, and diethylenetriamine tris [(meth)acrylamide]; vinyl compounds such as styrene, diallyl phthalate, divinyl succinate, divinyl adipate, and divinyl phthalate; and combinations thereof. Preferably, such additional compounds are liquids.

In order to achieve satisfactory results, the weight ratio of the at least one cationically polymerizable aliphatic epoxide having an epoxy group functionality of 2 (component (a)) to the at least one free-radically polymerizable compound having a free-radically polymerizable group functionality of 3 (component (b)) should be in the range of from 25:75 to 75:25, inclusive. Preferably, the weight ratio of component (a) to component (b) is in the range of from 30:70 to 70:30, inclusive. More preferably, the weight ratio of component (a) to component (b) is in the range of from 35:65 to 65:35, inclusive. Most preferably, the weight ratio of component (a) to component (b) is in the range of from 40:60 to 60:40, inclusive.

Other materials such as, for example, binders, plasticizers, stabilizers, surfactants, antistatic agents, coating aids, lubricants, and/or fillers can also be present in the photoreactive composition. Many photoreactive species are commercially supplied with inhibitor(s) present to prevent premature reaction of the photoreactive species. In such cases, the inhibitor may be removed, although in practice of the present disclosure this is typically not necessary.

In order to absorb light in a multiphoton process, the multiphoton initiator includes a multiphoton absorber (such as, e.g., a photosensitizer). In one embodiment, the multiphoton photoinitiator system includes a multiphoton absorber, an electron acceptor, and an optional electron donor.

Useful multiphoton absorbers may have a two-photon absorption cross-section greater than or equal to the maximum two-photon absorption cross-section of fluorescein (i.e., greater than that of 3',6'-dihydroxyspiro[isobenzofuran-1(3H),9'-[9H]xanthen]-3-one). At commonly used wavelengths, this typically translates to a two-photon cross-section of greater than about $50 \times 10^{-50}$ $cm^4$ sec/photon as can be determined, for example, according to the method described by C. Xu and W. W. Webb in *J. Opt. Soc. Am. B* (1996), 13, pp. 481-491 and PCT Pat. Publ. No. WO 98/21521 (Marder). Preferably, the two-photon absorption cross-section of the multiphoton absorber, at one or more wavelengths of the light used in practice of the present disclosure, is greater than or equal to the maximum two-photon absorption cross-section of fluorescein.

This method involves the comparison (under identical excitation intensity and multiphoton absorber concentration conditions) of the two-photon fluorescence intensity of the multiphoton absorber with that of a reference compound. The reference compound can be selected to match as closely as possible the spectral range covered by the multiphoton absorber absorption and fluorescence. In one possible experimental set-up, an excitation beam can be split into two arms, with half of the excitation intensity going to the multiphoton absorber and half to the reference compound. The relative fluorescence intensity of the multiphoton absorber with respect to the reference compound can then be measured using two photomultiplier tubes or other calibrated detector. Finally, the fluorescence quantum efficiency of both compounds can be measured under one-photon excitation.

Methods of determining fluorescence and phosphorescence quantum yields are well known in the art. Typically, the area under the fluorescence (or phosphorescence) spectrum of a compound of interest is compared with the area under the fluorescence (or phosphorescence) spectrum of a standard luminescent compound having a known fluorescence (or phosphorescence) quantum yield, and appropriate corrections are made (which take into account, for example, the optical density of the composition at the excitation wavelength, the geometry of the fluorescence detection apparatus, the differences in the emission wavelengths, and the response of the detector to different wavelengths). Standard methods are described, for example, by J. N. Demas and G. A. Crosby in *J. Phys. Chem.* (1971), 75, pp. 991-1024; and by J. V. Morris, M. A. Mahoney, and J. R. Huber in *J. Phys. Chem.* (1976), 80, pp. 969-974.

Assuming that the emitting state is the same under one- and two-photon excitation (a common assumption), the two-photon absorption cross-section of the multiphoton absorber, ($\delta_{sam}$), is equal to $\delta_{ref}$ K $(I_{sam}/I_{ref})(\Phi_{sam}/\Phi_{ref})$, wherein $\delta_{ref}$ is the two-photon absorption cross-section of the reference compound, $I_{sam}$ is the fluorescence intensity of the multiphoton absorber, $I_{ref}$ is the fluorescence intensity of the reference compound, $\Phi_{sam}$ is the fluorescence quantum efficiency of the multiphoton absorber, $\Phi_{ref}$ is the fluorescence quantum efficiency of the reference compound, and K is a correction factor to account for slight differences in the optical path and response of the two detectors. K can be determined by measuring the response with the same multiphoton absorber in both the sample and reference arms. To ensure a valid measurement, the clear quadratic dependence of the two-photon fluorescence intensity on excitation power can be confirmed, and relatively low concentrations of both the multiphoton absorber and the reference compound can be utilized (to avoid fluorescence re-absorption and multiphoton absorber aggregation effects).

If the multiphoton absorber is not fluorescent, the yield of electronic excited states can be measured and compared with a known standard. In addition to the above-described method of determining fluorescence yield, various methods of measuring excited state yield are known (including, for example, transient absorbance, phosphorescence yield, and photoproduct formation or disappearance of multiphoton absorber (due to photoreaction). Preferably, the two-photon absorption cross-section of the multiphoton absorber is greater than about 1.5 times that of fluorescein (or alternatively, greater than about $75 \times 10^{-50}$ cm$^4$sec/photon, as measured by the above method); more preferably, greater than about twice that of fluorescein (or, alternatively, greater than about $100 \times 10^{-50}$ cm$^4$sec/photon); more preferably, greater than about three times that of fluorescein (or, alternatively, greater than about $150 \times 10^{-50}$ cm$^4$sec/photon); and more preferably, greater than about four times that of fluorescein (or, alternatively, greater than about $200 \times 10^{-50}$ cm$^4$sec/photon).

A multiphoton absorber may be selected based in part upon shelf stability considerations. Accordingly, selection of a particular multiphoton absorber can depend to some extent upon the particular photoreactive species utilized (as well as upon the choices of electron donor compound and/or electron acceptor). Useful multiphoton absorbers include, for example, those exhibiting large multi-photon absorption cross-sections, such as Rhodamine B (that is, N-[9-(2-carboxyphenyl)-6-(diethylamino)-3H-xanthen-3-ylidene]-N-ethylethanaminium chloride and the hexafluoroantimonate salt of Rhodamine B) and the four classes of multiphoton absorbers described in PCT Pat. Publ. Nos. WO 98/21521 (Marder) and WO 99/53242 (Cumptson). The four classes can be described as follows: (a) molecules in which two donors are connected to a conjugated π-electron bridge; (b) molecules in which two donors are connected to a conjugated π-electron bridge which is substituted with one or more electron accepting groups; (c) molecules in which two acceptors are connected to a conjugated π-electron bridge; and (d) molecules in which two acceptors are connected to a conjugated π-electron bridge which is substituted with one or more electron donating groups (where "bridge" means a molecular fragment that connects two or more chemical groups, "donor" means an atom or group of atoms with a low ionization potential that can be bonded to a conjugated π-electron bridge, and "acceptor" means an atom or group of atoms with a high electron affinity that can be bonded to a conjugated π-electron bridge). Representative examples of such multiphoton absorbers include the following:

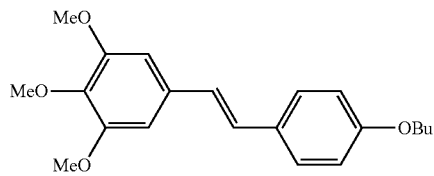
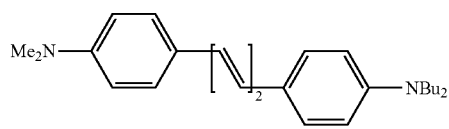
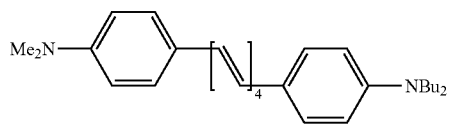
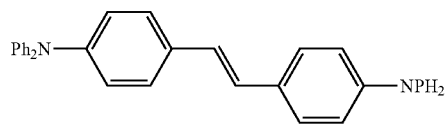
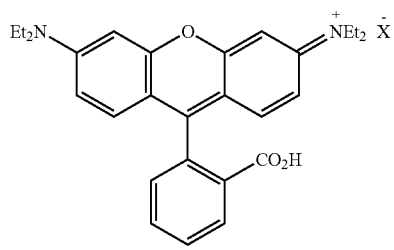

wherein $X^- = PF_6^-, SbF_6^-, AsF_6^-, BF_4^-$

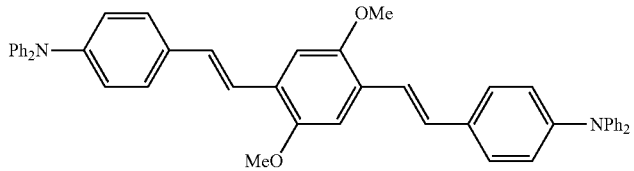
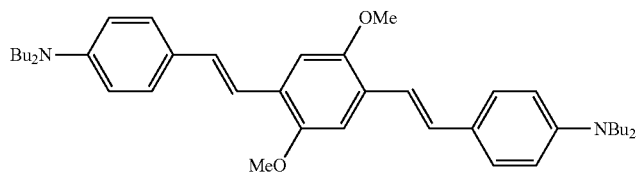

-continued
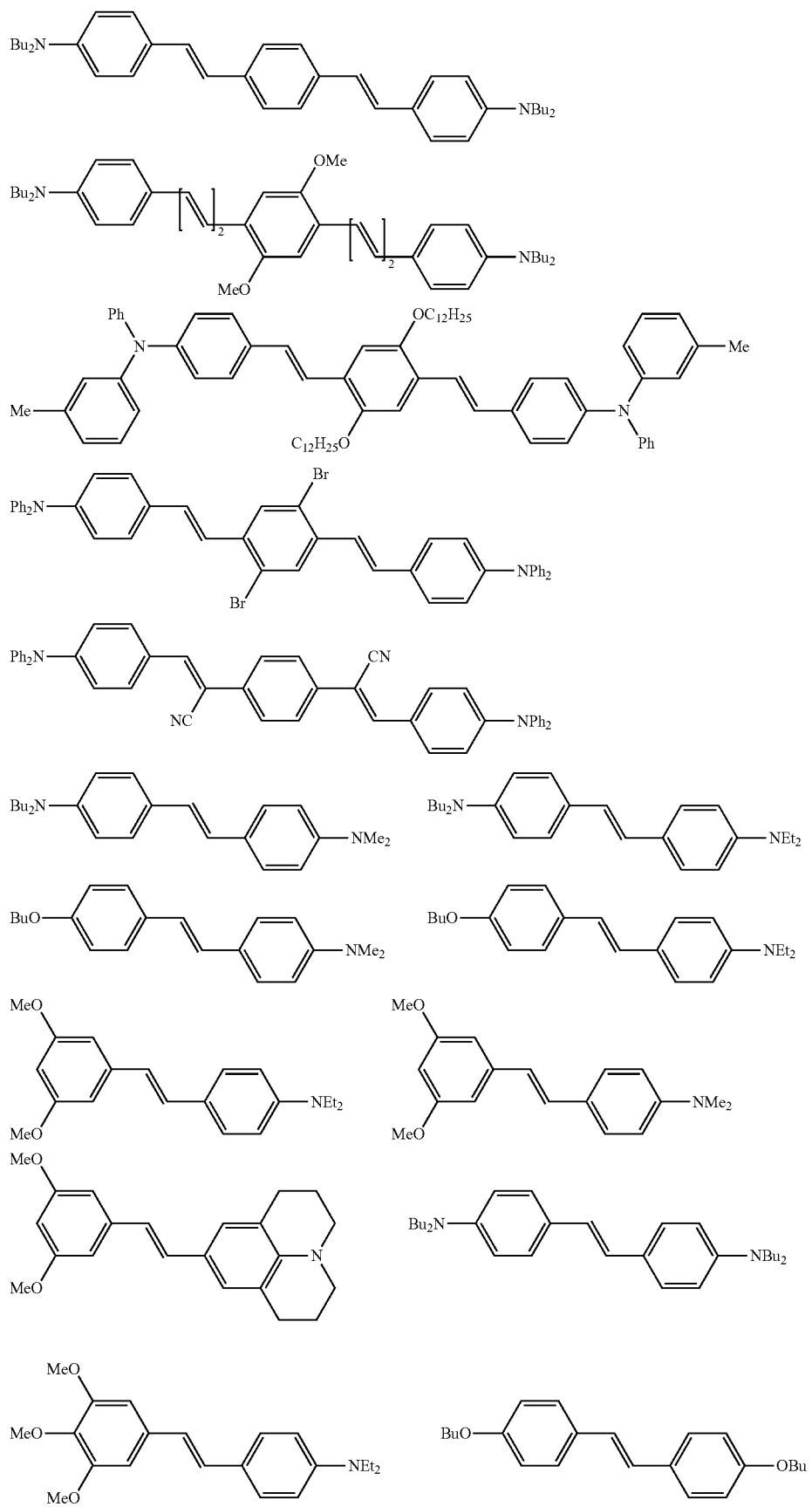

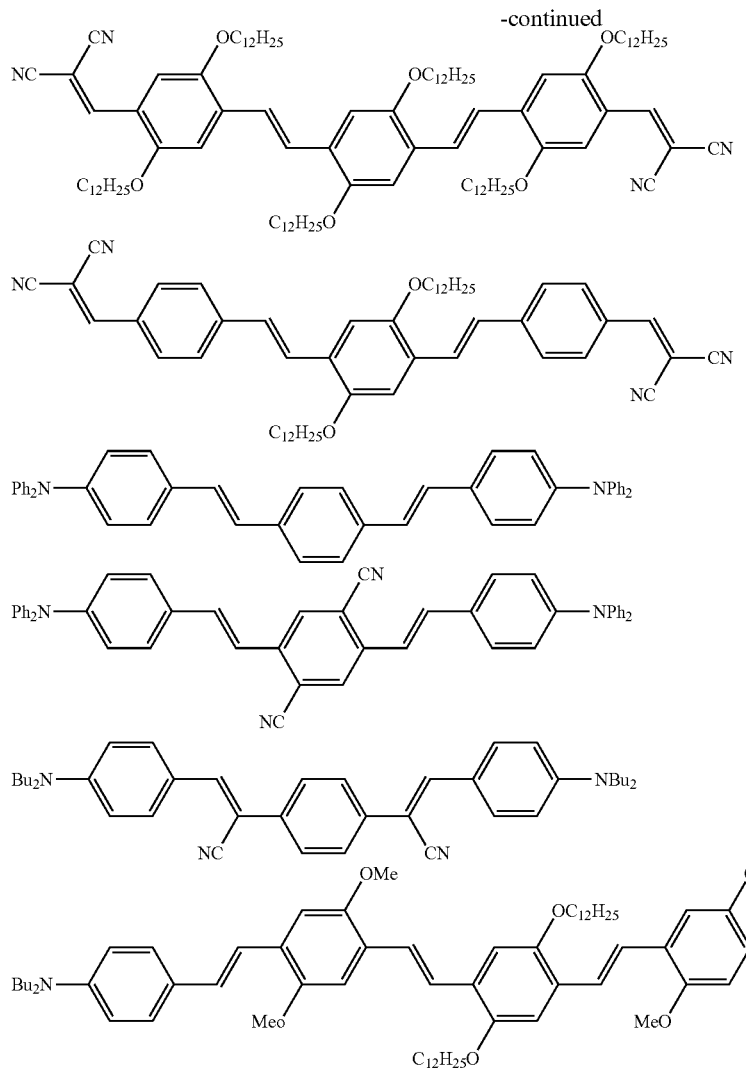

One preferred two-photon sensitizer is 2,5-bis[4-(diphenylamino)stryl]-1-(2-ethylhexyloxy)-4-methoxybenzene, which has the structural formula:

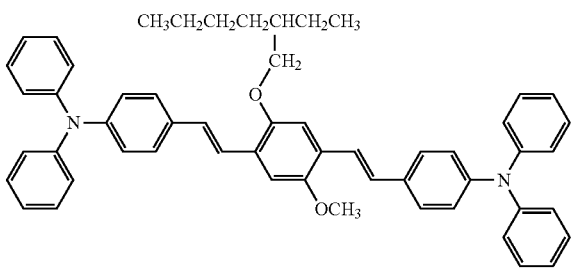

The four classes of multiphoton absorbers described above can be prepared, for example, by reacting aldehydes with ylides under standard Wittig conditions or by using the McMurray reaction, as detailed in PCT Pat. Publ. No. WO 98/21521 (Marder).

Other suitable compounds are described in U.S. Pat. No. 6,100,405 (Reinhardt et al.), U.S. Pat. No. 5,859,251 (Reinhardt et al.), and U.S. Pat. No. 5,770,737 (Reinhardt et al.) as having large multiphoton absorption cross-sections, although their multiphoton absorption cross-sections were determined by a method other than that described above. Such compounds include molecules in which an electron donating group and an electron accepting group are connected to a conjugated π-electron bridge.

Suitable electron acceptors for the liquid photoreactive compositions are capable of being photosensitized by accepting an electron from an electronic excited state of the multiphoton absorber, resulting in the formation of at least acid. Such electron acceptors include, for example, iodonium salts (for example, diaryliodonium salts), diazonium salts (for example, phenyldiazonium salts optionally substituted with groups such as alkyl, alkoxy, halo, or nitro), sulfonium salts (for example, triarylsulfonium salts optionally substituted with alkyl or alkoxy groups, and optionally having 2,2'-oxy groups bridging adjacent aryl moieties), and combinations thereof.

The electron acceptor is preferably soluble in the photoreactive species and is preferably shelf-stable (that is, does not spontaneously promote reaction of the photoreactive species if dissolved therein in the presence of the multiphoton absorber and an electron donor compound). Accordingly, selection of a particular electron acceptor can depend to some extent upon the particular photoreactive species, multiphoton absorber, and electron donor compound chosen, as described above.

Suitable iodonium salts include those described in U.S. Pat. No. 5,545,676 (Palazzotto et al.), U.S. Pat. No. 3,729,313 (Smith), U.S. Pat. No. 3,741,769 (Smith), U.S. Pat. No. 3,808,006 (Smith et al.), U.S. Pat. No. 4,250,053 (Smith), and U.S. Pat. No. 4,394,403 (Smith). The iodonium salt can be a simple salt (for example, containing an anion such as Cl$^-$, Br$^-$, I$^-$ or C$_4$H$_5$SO$_3{}^-$) or a metal complex salt (for example, containing SbF$_6{}^-$, PF$_6{}^-$, BF$_4{}^-$, tetrakis(perfluorophenyl)borate, SbF$_5$OH$^-$ or AsF$_6{}^-$). Mixtures of iodonium salts can be used if desired.

Examples of useful aromatic iodonium complex salt electron acceptors include diphenyliodonium tetrafluoroborate; di(4-methylphenyl)iodonium tetrafluoroborate; phenyl-4-methylphenyliodonium tetrafluoroborate; di(4-heptylphenyl)iodonium tetrafluoroborate; di(3-nitrophenyl)iodonium hexafluorophosphate; di(4-chlorophenyl)iodonium hexafluorophosphate; di(naphthyl)iodonium tetrafluoroborate; di(4-trifluoromethylphenyl)iodonium tetrafluoroborate; diphenyliodonium hexafluorophosphate; di(4-methylphenyl)iodonium hexafluorophosphate; diphenyliodonium hexafluoroarsenate; di(4-phenoxyphenyl)iodonium tetrafluoroborate; phenyl-2-thienyliodonium hexafluorophosphate; 3,5-dimethylpyrazolyl-4-phenyliodonium hexafluorophosphate; diphenyliodonium hexafluoroantimonate; 2,2'-diphenyliodonium tetrafluoroborate; di(2,4-dichlorophenyl)iodonium hexafluorophosphate; di(4-bromophenyl)iodonium hexafluorophosphate; di(4-methoxyphenyl)iodonium hexafluorophosphate; di(3-carboxyphenyl)iodonium hexafluorophosphate; di(3-methoxycarbonylphenyl)iodonium hexafluorophosphate; di(3-methoxysulfonylphenyl)iodonium hexafluorophosphate; di(4-acetamidophenyl)iodonium hexafluorophosphate; di(2-benzothienyl)iodonium hexafluorophosphate; diphenyliodonium hexafluoroantimonate; and combinations thereof. Aromatic iodonium complex salts can be prepared by metathesis of corresponding aromatic iodonium simple salts (for example, diphenyliodonium bisulfate) in accordance with the teachings of Beringer et al., *J. Am. Chem. Soc.* (1959), 81, pp. 342-351.

Preferred diaryliodonium salts include diphenyliodonium salts (such as diphenyliodonium chloride, diphenyliodonium hexafluorophosphate, and diphenyliodonium tetrafluoroborate), diaryliodonium hexafluoroantimonate (for example, as available as PC-2506 from Polyset, Inc., Mechanicville, N.Y.), and combinations thereof.

Suitable anions X$^-$ for the sulfonium salts (and for any of the other types of electron acceptors) include a variety of anion types such as, for example, imide, methide, boron-centered, phosphorous-centered, antimony-centered, arsenic-centered, and aluminum-centered anions.

Illustrative examples of suitable imide and methide anions include (C$_2$F$_5$SO$_2$)$_2$N$^-$, (C$_4$F$_9$SO$_2$)$_2$N$^-$, (C$_8$F$_{17}$SO$_2$)$_3$C$^-$, (CF$_3$SO$_2$)$_3$C$^-$, (CF$_3$SO$_2$)$_2$N$^-$, (C$_4$F$_9$SO$_2$)$_3$C$^-$, (CF$_3$SO$_2$)$_2$(C$_4$F$_9$SO$_2$)C$^-$, (CF$_3$SO$_2$)(C$_4$F$_9$SO$_2$)N$^-$, ((CF$_3$)$_2$NC$_2$F$_4$SO$_2$)$_2$N$^-$, (CF$_3$)$_2$NC$_2$F$_4$SO$_2$C$^-$(SO$_2$CF$_3$)$_2$, (3,5- bis(CF$_3$)C$_6$H$_3$)SO$_2$N$^-$SO$_2$CF$_3$, C$_6$H$_5$SO$_2$C$^-$(SO$_2$CF$_3$)$_2$, and C$_6$H$_5$SO$_2$N—SO$_2$CF$_3$. Preferred anions of this type include those represented by the formula (R$_f$SO$_2$)$_3$C$^-$, wherein R$_f$ is a perfluoroalkyl radical having from 1 to about 4 carbon atoms.

Illustrative examples of suitable boron-centered anions include F$_4$B$^-$, (3,5-bis(CF$_3$)C$_6$H$_3$)$_4$B$^-$, (C$_6$F$_5$)$_4$B$^-$, (p-CF$_3$C$_6$H$_4$)$_4$B$^-$, (m-CF$_3$C$_6$H$_4$)$_4$B$^-$, (p-FC$_6$H$_4$)$_4$B$^-$, (C$_6$F$_5$)$_3$(CH$_3$)B$^-$, (C$_6$F$_5$)$_3$(n-C$_4$H$_9$)B$^-$, (p-CH$_3$C$_6$H$_4$)$_3$(C$_6$F$_5$)B$^-$, (C$_6$F$_5$)$_3$FB$^-$, (C$_6$H$_5$)$_3$(C$_6$F$_5$)B$^-$, (CH$_3$)$_2$(p-CF$_3$C$_6$H$_4$)$_2$B$^-$, and (C$_6$F$_5$)$_3$(n-C$_{18}$H$_{37}$O )B$^-$. Preferred boron-centered anions generally contain 3 or more halogen-substituted aromatic hydrocarbon radicals attached to boron, with fluorine being the more preferred halogen. Illustrative examples of the preferred anions include (3,5-bis(CF$_3$)C$_6$H$_3$)$_4$B$^-$, (C$_6$F$_5$)$_4$B$^-$, (C$_6$F$_5$)$_3$(n-C$_4$H$_9$)B$^-$, (C$_6$F$_5$)$_3$FB$^-$, and (C$_6$F$_5$)$_3$(CH$_3$)B$^-$.

Suitable anions containing other metal or metalloid centers include, for example, (3,5-bis(CF$_3$)C$_6$H$_3$)$_4$Al$^-$(C$_6$F$_5$)$_4$Al$^-$(C$_6$F$_5$)$_2$PF$_4{}^-$, (C$_6$F$_5$)PF$_5{}^-$, PF$_6{}^-$, (C$_6$F$_5$)SbF$_5{}^-$, SbF$_6{}^-$, SbF$_5$OH$^-$, and AsF$_6{}^-$. Preferably, X$^-$ is selected from tetrafluoroborate, hexafluorophosphate, hexafluoroarsenate, hexafluoroantimonate, and hydroxypentafluoro-antimonate (for example, for use with cationically-curable species such as epoxy resins).

Examples of suitable sulfonium salt electron acceptors include: triphenylsulfonium tetrafluoroborate, methyldiphenylsulfonium tetrafluoroborate, dimethylphenylsulfonium hexafluorophosphate, triphenylsulfonium hexafluorophosphate, triphenylsulfonium hexafluoroantimonate, diphenyl-naphthylsulfonium hexafluoroarsenate, tritolylsulfonium hexafluorophosphate, anisyldiphenylsulfonium hexafluoroantimonate, 4-butoxyphenyldiphenylsulfonium tetrafluoroborate, 4-chlorophenyldiphenylsulfonium hexafluorophosphate, tri(4-phenoxyphenyl)sulfonium hexafluorophosphate, di(4-ethoxyphenyl)methylsulfonium hexafluoroarsenate, 4-acetonylphenyldiphenylsulfonium tetrafluoroborate, 4-thiomethoxyphenyldiphenylsulfonium hexafluorophosphate, di(methoxysulfonylphenyl)methylsulfonium hexafluoroantimonate, di(nitrophenyl)phenylsulfonium hexafluoroantimonate, di(carbomethoxyphenyl)methylsulfonium hexafluorophosphate, 4-acetamidophenyldiphenylsulfonium tetrafluoroborate, dimethylnaphthylsulfonium hexafluorophosphate, trifluoromethyldiphenylsulfonium tetrafluoroborate, p-(phenylthiophenyl)diphenylsulfonium hexafluoroantimonate, 10-methylphenoxanthenium hexafluorophosphate, 5-methylthianthrenium hexafluorophosphate, 10-phenyl-9,9-dimethylthioxanthenium hexafluorophosphate, 10-phenyl-9-oxothioxanthenium tetrafluoroborate, 5-methyl-10-oxothianthrenium tetrafluoroborate, and 5-methyl-10,10-dioxothianthrenium hexafluorophosphate.

Preferred sulfonium salts include triarylsulfonium salts such as triarylsulfonium hexafluoroantimonate (for example, available as PC-2505 from Polyset Co., Mechanicville, N.Y.), and triarylsulfonium hexafluorophosphate (for example, available as PC-2514 from Polyset Co.).

Preferred electron acceptors include photoacid generators, such as iodonium salts (more preferably, aryliodonium salts), sulfonium salts, and diazonium salts. More preferred are aryliodonium salts and arylsulfonium salts.

Useful optional electron donor compounds are compounds (other than the multiphoton absorber itself) that are capable of donating an electron to an electronic excited state of the multiphoton absorber. The electron donor compounds preferably have an oxidation potential that is greater than zero and less than or equal to that of p-dimethoxybenzene. Preferably, the oxidation potential is between about 0.3 and 1 volt vs. a standard saturated calomel electrode ("S.C.E.").

The electron donor compound is also preferably soluble in the photoreactive species and is selected based in part upon shelf stability considerations (as described above). Suitable donors are generally capable of increasing the speed of cure or the image density of a photoreactive composition upon exposure to light of the desired wavelength.

Those skilled in the art will recognize that the electron donor compound, if of significant basicity, can adversely affect the cationic reaction as described, for example, in U.S. Pat. No. 6,025,406 (Oxman et al.).

In general, electron donor compounds suitable for use with particular multiphoton absorbers and electron acceptors can be selected by comparing the oxidation and reduction potentials of the three components (as described, for example, in U.S. Pat. No. 4,859,572 (Farid et al.). The potentials reflect relative energy relationships and can be used in the manner described below to guide electron donor compound selection.

If the multiphoton absorber is in an electronic excited state, an electron in the highest occupied molecular orbital (HOMO) of the multiphoton absorber has been lifted to a higher energy level (namely, the lowest unoccupied molecular orbital (LUMO) of the multiphoton absorber), and a vacancy is left behind in the molecular orbital it initially occupied. The electron acceptor can accept the electron from the higher energy orbital, and the electron donor compound can donate an electron to fill the vacancy in the originally occupied orbital, provided certain relative energy relationships are satisfied.

If the reduction potential of the electron acceptor is less negative (or more positive) than that of the multiphoton absorber, an electron in the higher energy orbital of the multiphoton absorber is readily transferred from the multiphoton absorber to the lowest unoccupied molecular orbital (LUMO) of the electron acceptor, since this represents an exothermic process. Even if the process is instead slightly endothermic (that is, even if the reduction potential of the multiphoton absorber is up to 0.1 volt more negative than that of the electron acceptor) ambient thermal activation can readily overcome such a small barrier.

In an analogous manner, if the oxidation potential of the electron donor compound is less positive (or more negative) than that of the multiphoton absorber, an electron moving from the HOMO of the electron donor compound to the orbital vacancy in the multiphoton absorber is moving from a higher to a lower potential, which again represents an exothermic process. Even if the process is slightly endothermic (that is, even if the oxidation potential of the multiphoton absorber is up to 0.1 volt more positive than that of the electron donor compound), ambient thermal activation can readily overcome such a small barrier.

Slightly endothermic reactions in which the reduction potential of the multiphoton absorber is up to 0.1 volt more negative than that of the electron acceptor, or the oxidation potential of the multiphoton absorber is up to 0.1 volt more positive than that of the electron donor compound, occur in every instance, regardless of whether the electron acceptor or the electron donor compound first reacts with the multiphoton absorber in its excited state. If the electron acceptor or the electron donor compound is reacting with the multiphoton absorber in its excited state, it is preferred that the reaction be exothermic or only slightly endothermic. If the electron acceptor or the electron donor compound is reacting with the multiphoton absorber ion radical, exothermic reactions are still preferred, but still more endothermic reactions can be expected in many instances to occur. Thus, the reduction potential of the multiphoton absorber can be 0.2 volt or more, more negative than that of a second-to-react electron acceptor, or the oxidation potential of the multiphoton absorber can be 0.2 volt or more, more positive than that of a second-to-react electron donor compound.

Suitable electron donor compounds include, for example, those described in U.S. Pat. No. 6,025,406 (Oxman et al.), and U.S. Pat. No. 5,545,676 (Palazzotto et al.). Such electron donor compounds include, for example amines (including triethanolamine, hydrazine, 1,4-diazabicyclo[2.2.2]octane, triphenylamine (and its triphenylphosphine and triphenylarsine analogs), aminoaldehydes, and aminosilanes), amides (including phosphoramides), ethers (including thioethers), ureas (including thioureas), sulfinic acids and their salts, salts of ferrocyanide, ascorbic acid and its salts, dithiocarbamic acid and its salts, salts of xanthates, salts of ethylenediaminetetraacetic acid, salts of $(alkyl)_p (aryl)_q$ borates (p+q=4) (tetraalkylammonium salts preferred), various organometallic compounds such as $SnR_4$ compounds (where each R is independently chosen from among alkyl, aralkyl (particularly benzyl), aryl, and alkaryl groups) (for example, such compounds as n-$C_3H_7Sn(CH_3)_3$, (allyl)Sn$(CH_3)_3$, and (benzyl)Sn(n-$C_3H_7)_3$), ferrocene, and combinations thereof. The electron donor compound can be unsubstituted or can be substituted with one or more non-interfering substituents. Particularly preferred electron donor compounds contain an electron donor atom (such as a nitrogen, oxygen, phosphorus, or sulfur atom) and an abstractable hydrogen atom bonded to a carbon or silicon atom alpha to the electron donor atom.

Suitable ether electron donor compounds include, for example, 4,4'-dimethoxybiphenyl, 1,2,4-trimethoxybenzene, 1,2,4,5-tetramethoxybenzene, and combinations thereof. Suitable urea electron donor compounds include N,N'-dimethylurea, N,N-dimethylurea, N,N'-diphenylurea, tetramethylthiourea, tetraethylthiourea, tetra-n-butylthiourea, N,N-di-n-butylthiourea, N,N'-di-n-butylthiourea, N,N-diphenylthiourea, N,N'-diphenyl-N,N'-diethylthiourea, and combinations thereof.

Preferred electron donor compounds for acid-induced reactions include 4-dimethylaminobenzoic acid, ethyl 4-dimethylaminobenzoate, 3-dimethylaminobenzoic acid, 4-dimethylaminobenzoin, 4-dimethylaminobenzaldehyde,4-dimethylaminobenzonitrile, 4-dimethylaminophenethyl alcohol, and 1,2,4-trimethoxybenzene.

It is within the scope of this disclosure that an electron donor, electron acceptor, or both can be covalently tethered to a multiphoton sensitizer as described, for example, in PCT Pat. Publ. No. WO 02/079691 (Marder). Other multiphoton photoinitiator systems such as, for example, those described in PCT Pat. Publ. No. WO 98/21521 (Marder) may also be used.

Cationically polymerizable epoxides, compounds having free-radically polymerizable groups, multiphoton absorbers (e.g., two-photon sensitizers), optional electron donor compounds, and electron acceptor compounds can be prepared by the methods described above, or by other methods known in the art, or obtained from commercial sources. These components can be combined under "safe light" conditions using any order and manner of combination (optionally, with stirring or agitation), although it is sometimes desirable (from a shelf life and thermal stability standpoint) to add the multiphoton photoinitiator system last (and after any heating step that is optionally used to facilitate dissolution of other components).

Solvent can be used during mixing of the components of the photoreactive composition, if desired, provided the solvent is chosen so as to not react appreciably with the components of the composition. Suitable solvents include, for example, acetone, dichloromethane, tetrahydrofuran, cyclopentanone, and acetonitrile. Preferably, the liquid photoreactive composition contains less than 2 weight percent, less than 1 weight percent, less than 0.1 weight percent of solvent, or is even free of solvent (organic solvent and/or water), based on the total eight of the liquid photoreactive composition.

The photoreactive species (cationically polymerizable epoxides, compounds having free-radically polymerizable groups) themselves can also sometimes serve as a solvent for the other components.

Typically, the liquid photoreactive composition contains at least about 5 percent (preferably, at least about 10 percent; more preferably, at least about 20 percent) up to about 99.8 percent by weight of one or more photoreactive species, based on the total solids weight of the liquid photoreactive composition (i.e., the total weight of components other than any optional solvent that may be present). Components of the multiphoton photoinitiator system including, for example, the multiphoton absorber, electron acceptor, and optional electron donor are present in photochemically effective amounts (as defined above). For example, the liquid photoreactive composition may contain from about 0.01 percent (preferably, at least about 0.1 percent; more preferably, at least about 0.2 percent) up to about 10 percent (preferably, up to about 5 percent) by weight of one or more photosensitizers, and either or both of (i) from about 0.01 percent (preferably, at least about 0.1 percent; more preferably, at least about 0.2 percent) up to about 10 percent (preferably, up to about 5 percent) by weight of one or more electron donor compounds and (ii) from about 0.1 percent to about 10 percent by weight of one or more electron acceptor compounds (preferably, from about 0.1 percent to about 5 percent), based on the total weight of the liquid photoreactive composition exclusive of any optional solvent that may be present).

A wide variety of adjuvants can be included in the liquid photoreactive composition, depending upon the desired end use. Suitable adjuvants include, for example, solvents, diluents, resins, plasticizers, pigments, dyes, inorganic or organic reinforcing or extending fillers (at preferred amounts of about 10 percent to 90 percent by weight based on the total weight of the composition), thixotropic agents, indicators, inhibitors, stabilizers, ultraviolet absorbers, and medicaments (e.g., leachable fluorides). However, to avoid effects such as, for example, light scattering and diffusion during reaction leading to inhomogeneity in the final three-dimensional structure, it may be desirable that the liquid photoreactive composition be essentially free of inorganic particles (e.g., metallic particles and nanoparticles). The amounts and types of such adjuvants and their manner of addition to the compositions will be familiar to those skilled in the art.

Prior to exposing the liquid photoreactive composition to light, it is typically coated onto a substrate, if desired, by any of a variety of coating methods known to those skilled in the art (including, for example, knife coating, spin coating, or pouring). The substrate can be chosen from a wide variety of films, sheets, and other surfaces, depending upon the particular application and the method of exposure to be utilized. Preferred substrates are generally sufficiently flat to enable the preparation of a layer of photoreactive composition having a uniform thickness. For applications where coating is less desirable, the liquid photoreactive composition can alternatively be exposed in bulk form.

SELECT EMBODIMENTS OF THE PRESENT DISCLOSURE

In a first embodiment, the present disclosure provides a method of fabricating a structure, the method comprising steps:

(i) disposing a liquid photoreactive composition on a substrate, wherein the liquid photoreactive composition comprises components:
 (a) at least one cationically polymerizable aliphatic epoxide having an epoxy group functionality of 2;
 (b) at least one free-radically polymerizable compound having a free-radically polymerizable group functionality of 3; and
 (c) an effective amount of a two-photon photoinitiator system comprising:
 a two-photon sensitizer; and
 an aromatic onium salt,
 wherein component (a) and component (b) are present in a respective weight ratio of from 25:75 to 75:25, inclusive; and
(ii) exposing a portion of the liquid photoreactive composition to laser light of sufficient intensity and wavelength to cause polymerization via two-photon excitation of the two-photon sensitizer and polymerization of a portion of the liquid photoreactive composition thereby providing an exposed composition; and
(iii) developing the exposed composition to provide the structure.

In a second embodiment, the present disclosure provides a method according to the first embodiment, wherein the liquid photoreactive composition contains less than one weight percent of organic solvent, based on the total weight of the liquid photoreactive composition.

In a third embodiment, the present disclosure provides a method according to the first or second embodiment, wherein the liquid photoreactive composition is free of organic solvent.

In a fourth embodiment, the present disclosure provides a method according to any one of the first to third embodiments, wherein the liquid photoreactive composition further comprises at least one cationically polymerizable aliphatic epoxide having an epoxy group functionality other than 2, and wherein the average cationically polymerizable aliphatic epoxide functionality is 1.8 to 2.2.

In a fifth embodiment, the present disclosure provides a method according to any one of the first to fourth embodiments, wherein the liquid photoreactive composition further comprises at least one free-radically polymerizable compound having a free-radically polymerizable group functionality other than 3, and wherein the average free-radically polymerizable group functionality is 2.8 to 3.2.

In a sixth embodiment, the present disclosure provides a method according to any one of the first to fifth embodiments, wherein the liquid photoreactive composition is free of metallic particles.

In a seventh embodiment, the present disclosure provides a method according to any one of the first to sixth embodiments, wherein component (a) and component (b) are present in a respective weight ratio of from 30:70 to 70:30, inclusive.

In an eighth embodiment, the present disclosure provides a method according to any one of the first to sixth embodiments, wherein component (a) and component (b) are present in a respective weight ratio of from 35:65 to 65:35, inclusive.

In a ninth embodiment, the present disclosure provides a method according to any one of the first to sixth embodiments, wherein component (a) and component (b) are present in a respective weight ratio of from 40:60 to 60:40, inclusive.

In a tenth embodiment, the present disclosure provides a method according to any one of the first to ninth embodiments, wherein the at least one cationically polymerizable aliphatic epoxide having an epoxy group functionality of 2 comprises 3,4-epoxycyclohexylmethyl 3,4-epoxycyclohexylcarboxylate.

In an eleventh embodiment, the present disclosure provides a method according to any one of the first to tenth embodiments, wherein at least one free-radically polymerizable compound having a free-radically polymerizable group functionality of 3 comprises trimethylolpropane triacrylate.

In a twelfth embodiment, the present disclosure provides a method according to any one of the first to eleventh embodiments, wherein the aromatic onium salt comprises at least one of a diaryliodonium salt or a triarylsulfonium salt.

In a thirteenth embodiment, the present disclosure provides a method according to any one of the first to twelfth embodiments, wherein the two-photon sensitizer comprises 2,5-bis[4-(diphenylamino)stryl]-1-(2-ethylhexyloxy)-4-methoxybenzene.

In a fourteenth embodiment, the present disclosure provides a method according to any one of the first to thirteenth embodiments, wherein steps (i), (ii), and (iii) are consecutive.

In a fifteenth embodiment, the present disclosure provides a liquid photoreactive composition comprising components:
(a) at least one cationically polymerizable aliphatic epoxide having an epoxy group functionality of 2;
(b) at least one free-radically polymerizable compound having a free-radically polymerizable group functionality of 3; and
(c) an effective amount of a two-photon photoinitiator system comprising:
a two-photon sensitizer; and
an aromatic onium salt,
wherein the liquid photoreactive composition contains less than one percent by weight of organic solvent, and wherein component (a) and component (b) are present in a respective weight ratio of from 25:75 to 75:25, inclusive.

In a sixteenth embodiment, the present disclosure provides a liquid photoreactive composition according to the fifteenth embodiment, wherein the liquid photoreactive composition is free of organic solvent.

In a seventeenth embodiment, the present disclosure provides a liquid photoreactive composition according to the fifteenth or sixteenth embodiment, wherein the liquid photoreactive composition further comprises at least one cationically polymerizable aliphatic epoxide having an epoxy group functionality other than 2, and wherein the average cationically polymerizable aliphatic epoxide functionality is 1.8 to 2.2.

In an eighteenth embodiment, the present disclosure provides a liquid photoreactive composition according to any one of the fifteenth to seventeenth embodiments, wherein the liquid photoreactive composition further comprises at least one free-radically polymerizable compound having a free-radically polymerizable group functionality other than 3, and wherein the average free-radically polymerizable group functionality is 2.8 to 3.2.

In a nineteenth embodiment, the present disclosure provides a liquid photoreactive composition according to any one of the fifteenth to eighteenth embodiments, wherein the liquid photoreactive composition is free of metallic particles.

In a twentieth embodiment, the present disclosure provides a liquid photoreactive composition according to any one of the fifteenth to nineteenth embodiments, wherein component (a) and component (b) are present in a respective weight ratio of from 30:70 to 70:30, inclusive.

In a twenty-first embodiment, the present disclosure provides a liquid photoreactive composition according to any one of the fifteenth to nineteenth embodiments, wherein component (a) and component (b) are present in a respective weight ratio of from 35:65 to 65:35, inclusive.

In a twenty-second embodiment, the present disclosure provides a liquid photoreactive composition according to any one of the fifteenth to nineteenth embodiments, wherein component (a) and component (b) are present in a respective weight ratio of from 40:60 to 60:40, inclusive.

In a twenty-third embodiment, the present disclosure provides a liquid photoreactive composition according to any one of the fifteenth to twenty-second embodiments, wherein the at least one cationically polymerizable aliphatic epoxide having an epoxy group functionality of 2 comprises 3,4-epoxycyclohexylmethyl 3,4-epoxycyclohexylcarboxylate.

In a twenty-fourth embodiment, the present disclosure provides a liquid photoreactive composition according to any one of the fifteenth to twenty-third embodiments, wherein the at least one free-radically polymerizable compound having a free-radically polymerizable group functionality of 3 comprises trimethylolpropane triacrylate.

In a twenty-fifth embodiment, the present disclosure provides a liquid photoreactive composition according to any one of the fifteenth to twenty-fourth embodiments, wherein the aromatic onium salt comprises at least one of a diaryliodonium salt or a triarylsulfonium salt.

In a twenty-sixth embodiment, the present disclosure provides a liquid photoreactive composition according to any one of the fifteenth to twenty-fifth embodiments, wherein the two-photon sensitizer comprises 2,5-bis[4-(diphenylamino)stryl]-1-(2-ethylhexyloxy)-4-methoxybenzene.

Objects and advantages of this disclosure are further illustrated by the following non-limiting examples, but the particular materials and amounts thereof recited in these examples, as well as other conditions and details, should not be construed to unduly limit this disclosure.

EXAMPLES

Unless otherwise noted, all parts, percentages, ratios, etc. in the Examples and the rest of the specification are by weight. The percentage of photosensitizer (KL68) and onium salt is based on the total weight of combined liquid resin compounds.

Materials Used in the Examples

Alkoxylated trifunctional acrylate was obtained as SR9008 from Sartomer Co., Exton Pa.

PC-2506 diaryliodonium hexafluoroantimonate has the structure

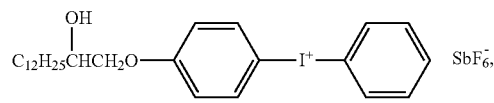

and was obtained from Polyset Co., Mechanicville, N.Y.

EPON 828 bisphenol A diglycidyl ether is available from Polysciences, Inc., Warrington, Pa.

ERL-4221 3,4-epoxycyclohexylmethyl 3,4-epoxycyclohexylcarboxylate (liquid) is available from Polysciences, Inc.

Poly(methyl methacrylate), 120,000 grams/mole, was obtained from Aldrich Chemical Co., Milwaukee, Wis.

Trimethylolpropane triacrylate (TMPTA, liquid) was obtained as SR351 from Sartomer Co., Exton, Pa.

Tris(2-hydroxyethyl) isocyanurate triacrylate was obtained as SR368 from Sartomer Co.

UVI-6976 cationic photoinitiator is a mixture of triarylsulfonium hexafluoroantimonate salts in propylene carbonate, available from Dow Chemical Co., Midland, Mich.

PREPARATION OF PRIMED SILICON WAFER

A stock solution containing a 0.5 weight percent of 2,5-bis[4-(diphenylamino)stryl]-1-(2-ethylhexyloxy)-4-methoxybenzene (KL68, synthesized as described in U.S. Pat. No. 7,265,161 (Leatherdale et al.)), 30 weight percent of poly(methyl methacrylate) (PMMA, 120,000 grams/mole), 35 weight percent of SR9008 alkoxylated trifunctional acrylate, and 35 weight percent of SR368 tris(2-hydroxyethyl) isocyanurate triacrylate was prepared as a 55 weight percent solids solution in cyclopentanone. It was then diluted to 9.17 percent by weight solids with cyclopentanone for use as a base coat solution. The base coat solution was spin coated onto one major surface of a silicon wafer and cured using a Model HSA-500 500 Watt high pressure Hg arc lamp (19.25 mW/cm$^2$ at 400 nm, total dose 69.3 J/cm$^2$) is resulting in a cured base coat thickness of 0.2-0.3 microns in thickness.

EXAMPLES 1-7 AND COMPARATIVE EXAMPLES A-E

Examples 1-7 and Comparative Examples A-E were prepared by combining: KL68, PC-2506 diaryliodonium hexafluoroantimonate, TMPTA, ERL-4221 in relative amounts as shown in Table 1 (below).

TABLE 1

| EXAMPLE | COMPONENT, parts by weight | | | | PHYSICAL STATE |
|---|---|---|---|---|---|
| | KL 68 | PC-2506 | TMPTA | ERL4221 | |
| 1 | 0.05 | 1.0 | 25 | 75 | liquid |
| 2 | 0.05 | 1.0 | 30 | 70 | liquid |
| 3 | 0.05 | 1.0 | 35 | 65 | liquid |
| 4 | 0.5 | 1.0 | 35 | 65 | liquid |
| 5 | 0.05 | 1.0 | 50 | 50 | liquid |
| 6 | 0.05 | 1.0 | 70 | 30 | liquid |
| 7 | 0.05 | 1.0 | 75 | 25 | liquid |
| Comparative Example A | 0.05 | 1.0 | 10 | 90 | liquid |
| Comparative Example B | 0.05 | 1.0 | 80 | 20 | liquid |
| Comparative Example C | 0.05 | 1.0 | 90 | 10 | liquid |
| Comparative Example D | 0.05 | 1.0 | 100 | 0 | liquid |
| Comparative Example E | 0.05 | 1.0 | 0 | 100 | liquid |

A few drops of each solution in Table 1 were placed on respective primed silicon wafers prepared as described above resulting in films of >60 microns.

General Procedure for Generating Contrast Curves

A simple research scale two-photon writing system was used to investigate writing speed threshold and longitudinal voxel size. The system was equipped with an ultrafast fiber laser having a center wavelength of 807 nm and a pulse width of 112 fs, laser beam power control, air objective (40×, numerical aperture 0.95), and electromagnetic shutter synchronized with the CAD file according to the writing parameters. Samples were mounted to a piezoelectric micro/nanopositioning X, Y, Z stage that was driven via computer. A confocal interface detection system was used to accurately and precisely determine the location of the substrate-photoresist interface. This system was capable of scan rates of about 1-400 microns per second.

Figure 2:
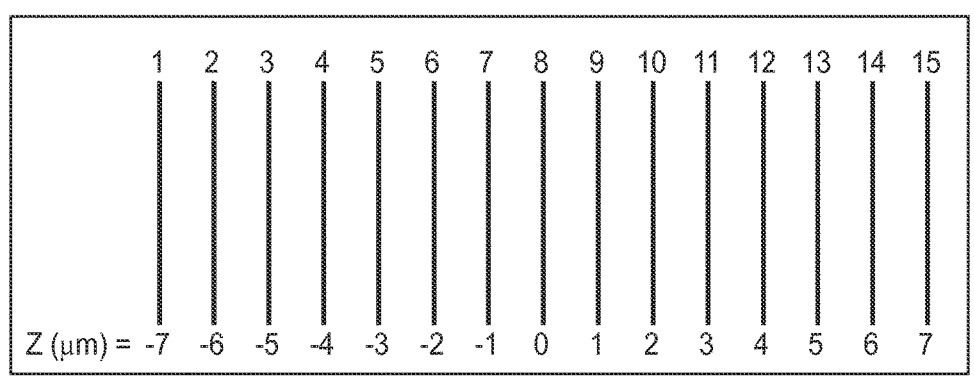
FIG. 2 is a two-dimensional, 15-line pattern used in the General Procedure for Generating Contrast Curves in the Examples hereinbelow.

For a given film, an array of 15 lines was written (shown in FIG. 2), each array at a different scan speed, and each line within an array at different z's relative to the interface between the substrate and photoresist, $z_o$, in 1 or 2 micron increments. The z-axis location of the lines in the middle of the range was set at the wafer-photoreactive composition interface. Those labels were written for identification use.

Scan speeds were chosen such that the speed was increased by a square root of two or a factor of two for other sets of line array, starting at a scan speed of about 1 micron/second.

After writing with the laser, the wafer with the exposed photoreactive composition was heated at 90° C. for 5 minutes on a hot plate, then cooled to room temperature and developed using 1-methoxy-2-propyl-acetate (PGMEA). Lines that were written above the threshold dose and located where the voxel intersected the substrate-photoreactive composition interface remained attached to the substrate. All others washed away in development. Counting the number of lines attached to the substrate yielded a measure of the voxel size perpendicular to the substrate. A plot of the voxel size vs. exposed energy dose (inversely proportional to writing speed) is called a contrast curve.

Figure 3:
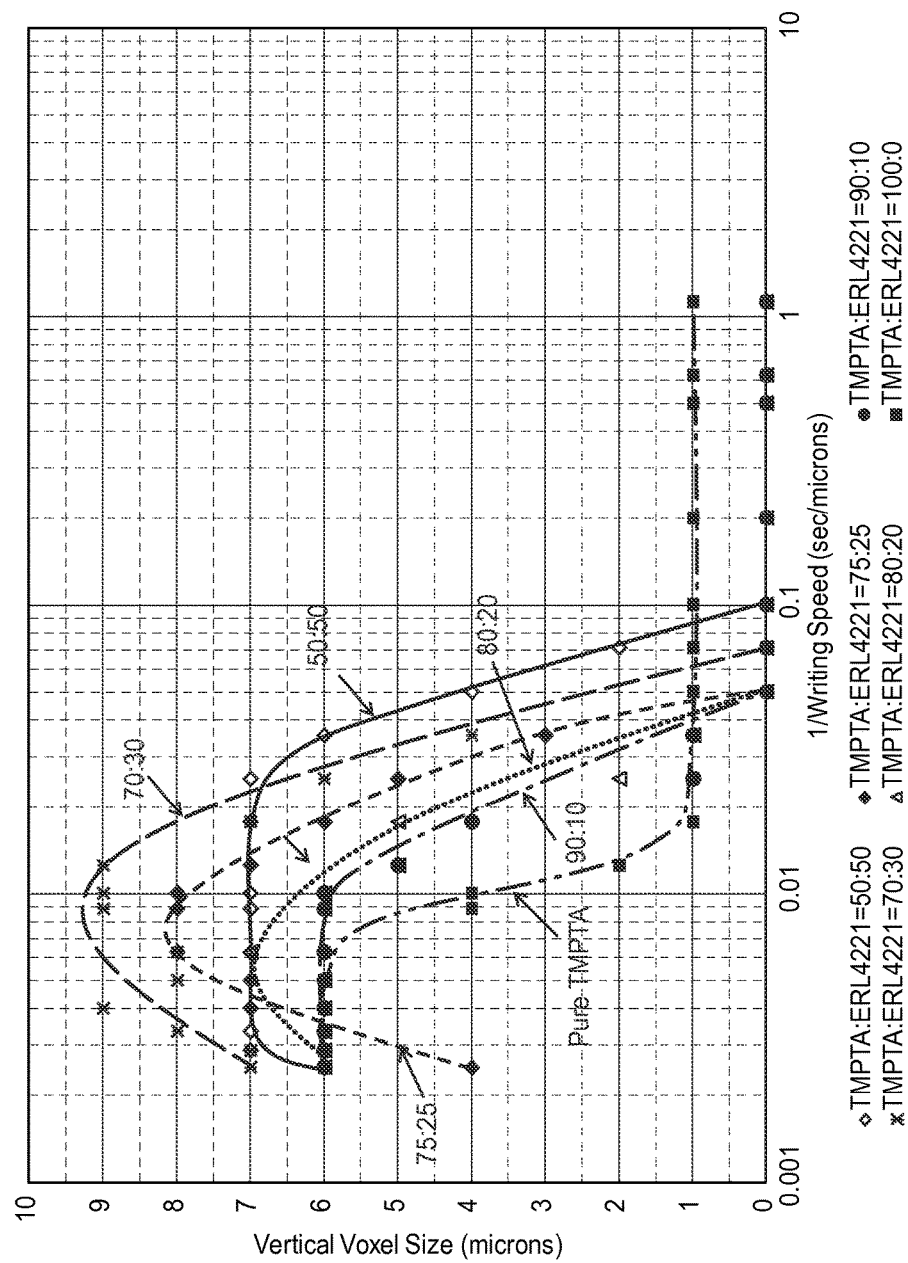
FIGS. 3 and 4 are contrast curves for Examples in Table 1.
Figure 4:
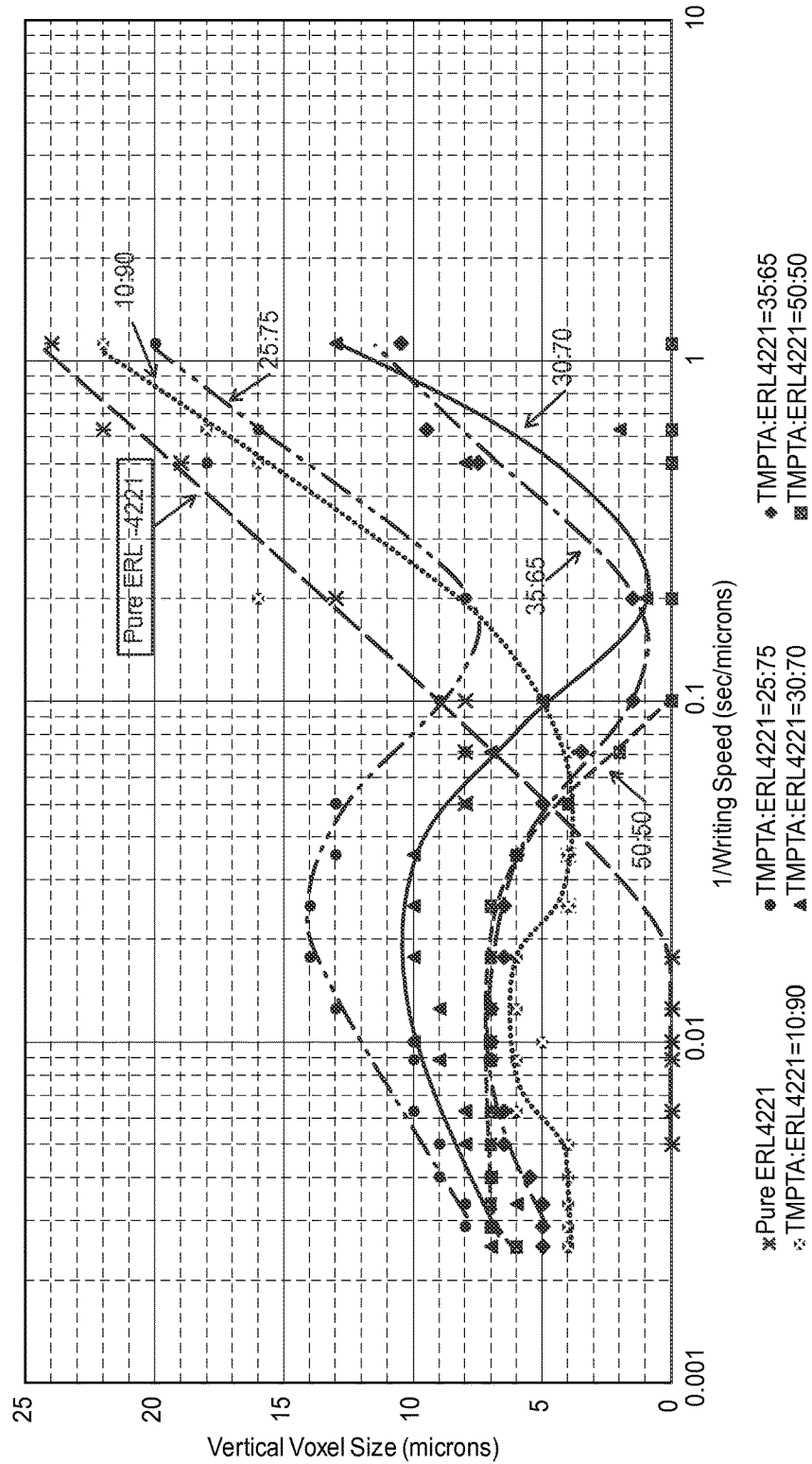

FIGS. 3 and 4 report contrast curves for Examples 1-6 and Comparative Examples A-E. Negative slope in FIGS. 3 and 4 indicates a region of negative contrast.

Formation of Cantilevers

Figure 5:
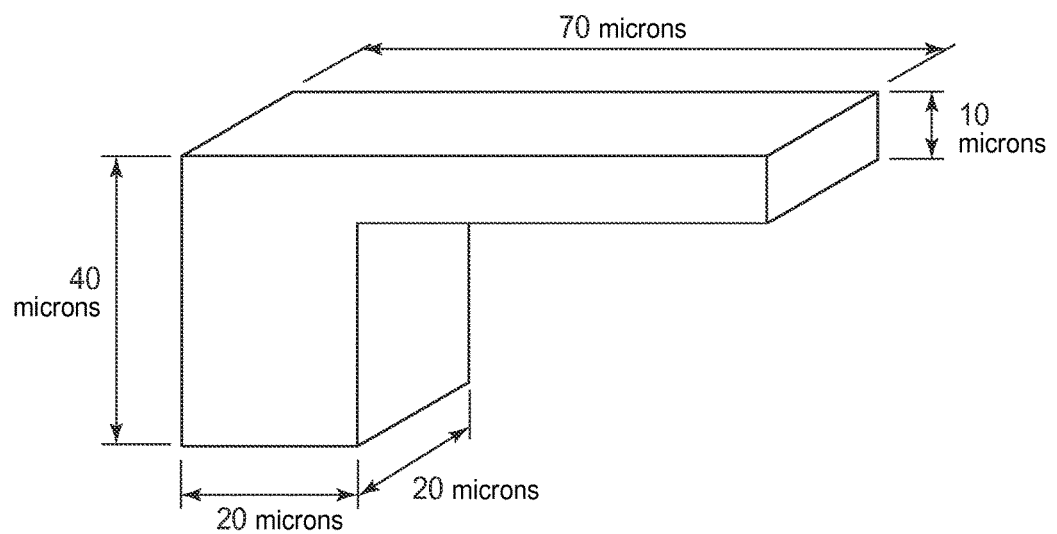
FIG. 5 is a scale drawing of the ideal cantilever structure used for Examples in Table 2.

We designed a simple cantilever structure, shown in FIG. 5, which can be written by the two-photon polymerization approach described above. Fabricated microstructures were viewed from the side by an optical microscope (e.g., a Keyence XY stage Digital Profilometer). If the viewed microstructure showed good fidelity, it indicated that the exposure conditions (e.g., power, wavelength, writing speed) were capable of producing a microstructure with sufficient mechanical integrity to survive development.

Writing speeds were selected by consulting the contrast curves in FIGS. 3 and 4, choosing a scan speed for each composition that corresponds with a voxel size of about 7 microns. Selected writing speeds and corresponding vertical voxel sizes for photoreactive compositions corresponding to each Example are shown in Table 1. Cantilevers were fabricated by directing the laser to expose the photoreactive composition according to the design in FIG. 5. Results are reported in Table 2 (below), wherein ratings were as follows:

0=no microstructure formed;
1=microstructure shaped like blob, no cantilever arm;
2=base of cantilever significantly larger than design, arm present and shorter than design;
3=good cantilever arm, angle of cantilever arm is distorted from 90°;
4=high fidelity base and cantilever arm according to FIG. 5.

TABLE 2

| EXAMPLE | REACTIVE COMPOSITION | WRITING SPEED, micron/second | VERTICAL VOXEL SIZE, microns | RATING | RATIO OF TMPTA TO ERL4221, weight/weight |
|---|---|---|---|---|---|
| 8 | Example 1 | 400 | 7 | 4 | 25:75 |
| 9 | Example 2 | 400 | 7 | 4 | 30:70 |
| 10 | Example 3 | 200 | 6.5 | 4 | 35:65 |
| 11 | Example 5 | 100 | 7 | 4 | 50:50 |
| 12 | Example 6 | 400 | 7 | 3 | 70:30 |
| 13 | Example 7 | 400 | 4 | 3.5 | 75:25 |
| Comparative Example F | Comparative Example B | 100 | 6 | 2 | 80:20 |
| Comparative Example G | Comparative Example D | 400 | 6 | 1 | 100:0 |
| Comparative Example H | Comparative Example E | 14 | 8 | 2 | 0:100 |

EXAMPLE 14

Example 4 in Table 1 was written with a Spectra-Physics (Santa Clara, Calif.) Ti-sapphire laser having a center wavelength of 800 nm, a pulse width of about 80 fs, electro-optic shutter, power control, dispersion compensation, confocal interface detection, high speed galvo-scanner, and an air objective (40×, NA=0.95). Sample positioning was controlled using a Newport air bearing stage. Stage and galvo-scanner were controlled by a custom CAD-based control system laser (power, etc.) at a writing speed of 112,500 microns/second resulting in high fidelity cylindrical posts with a diameter of 50 microns and a height of 900 microns.

EXAMPLE 15

An index matched (for glass of 1.515 at 800 nm wavelength) liquid photoreactive composition was prepared by combining 40 parts of EPON 828 aromatic epoxy resin, 30 parts of TMPTA, 30 parts of ERL-4221, 0.5 part of KL68, 1.0 part of PC-2506 diaryliodonium salt.

EXAMPLE 16

An index matched (for glass of 1.515 at 800 nm wavelength) liquid photoreactive composition was prepared by combining 40 parts of EPON 828 aromatic epoxy resin, 30 parts of TMPTA, 30 parts of ERL-4221, 0.5 part of KL68, and 1.0 part of UVI-6976 cationic photoinitiator. The liquid photoreactive composition of this example has better shelf stability and comparable speed relative to that of Example 15.

All cited references, patents, or patent applications in the above application for letters patent are herein incorporated by reference in their entirety in a consistent manner. In the event of inconsistencies or contradictions between portions of the incorporated references and this application, the information in the preceding description shall control. The preceding description, given in order to enable one of ordinary skill in the art to practice the claimed disclosure, is not to be construed as limiting the scope of the disclosure, which is defined by the claims and all equivalents thereto.

What is claimed is:

1. A method of fabricating a structure, the method comprising steps:
   disposing a liquid photoreactive composition on a substrate, wherein the liquid photoreactive composition comprises components:
   (a) at least one cationically polymerizable aliphatic epoxide having an epoxy group functionality of 2;
   (b) at least one free-radically polymerizable compound having a free-radically polymerizable group functionality of 3; and
   (c) an effective amount of a two-photon photoinitiator system comprising:
      a two-photon sensitizer; and
      an aromatic onium salt,
   wherein component (a) and component (b) are present in a respective weight ratio of from 25:75 to 75:25, inclusive; and
   (ii) exposing a portion of the liquid photoreactive composition to laser light of sufficient intensity and wavelength to cause polymerization via two-photon excitation of the two-photon sensitizer and polymerization of a portion of the liquid photoreactive composition thereby providing an exposed composition; and
   (iii) developing the exposed composition to provide the structure.

2. The method of claim 1, wherein the liquid photoreactive composition contains less than one weight percent of organic solvent, based on the total weight of the liquid photoreactive composition.

3. The method of claim 1, wherein the liquid photoreactive composition is free of organic solvent.

4. The method of claim 1, wherein the liquid photoreactive composition further comprises at least one cationically polymerizable aliphatic epoxide having an epoxy group functionality other than 2, and wherein the average cationically polymerizable aliphatic epoxide functionality is 1.8 to 2.2.

5. The method of claim 1, wherein the liquid photoreactive composition further comprises at least one free-radically polymerizable compound having a free-radically polymerizable group functionality other than 3, and wherein the average free-radically polymerizable group functionality is 2.8 to 3.2.

6. The method of claim 1, wherein the liquid photoreactive composition is free of metallic particles.

7. The method of claim 1, wherein component (a) and component (b) are present in a respective weight ratio of from 30:70 to 70:30, inclusive.

8. The method of claim 1, wherein component (a) and component (b) are present in a respective weight ratio of from 35:65 to 65:35, inclusive.

9. The method of claim 1, wherein component (a) and component (b) are present in a respective weight ratio of from 40:60 to 60:40, inclusive.

10. The method of claim 1, wherein the at least one cationically polymerizable aliphatic epoxide having an epoxy group functionality of 2 comprises 3,4-epoxycyclohexylmethyl 3,4-epoxycyclohexylcarboxylate.

11. The method of claim 1, wherein at least one free-radically polymerizable compound having a free-radically polymerizable group functionality of 3 comprises trimethylolpropane triacrylate.

12. The method of claim 1, wherein the aromatic onium salt comprises at least one of a diaryliodonium salt or a triarylsulfonium salt.

13. The method of claim 1, wherein the two-photon sensitizer comprises 2,5-bis[4-(diphenylamino)stryl]-1-(2-ethylhexyloxy)-4-methoxybenzene.

14. The method of claim 1, wherein steps (i), (ii), and (iii) are consecutive.

15. A liquid photoreactive composition comprising components:

(a) at least one cationically polymerizable aliphatic epoxide having an epoxy group functionality of 2;
(b) at least one free-radically polymerizable compound having a free-radically polymerizable group functionality of 3; and
(c) a photochemically effective amount of a two-photon photoinitiator system comprising:
  a two-photon sensitizer; and
  an aromatic onium salt,
wherein the liquid photoreactive composition contains less than one percent by weight of organic solvent, and wherein component (a) and component (b) are present in a respective weight ratio of from 25:75 to 75:25, inclusive.

16. The liquid photoreactive composition of claim 15, wherein the liquid photoreactive composition is free of organic solvent.

17. The liquid photoreactive composition of claim 15, wherein the liquid photoreactive composition further comprises at least one cationically polymerizable aliphatic epoxide having an epoxy group functionality other than 2, and wherein the average cationically polymerizable aliphatic epoxide functionality is 1.8 to 2.2.

18. The liquid photoreactive composition of claim 15, wherein the liquid photoreactive composition further comprises at least one free-radically polymerizable compound having a free-radically polymerizable group functionality other than 3, and wherein the average free-radically polymerizable group functionality is 2.8 to 3.2.

19. The liquid photoreactive composition of claim 15, wherein the liquid photoreactive composition is free of metallic particles.

20. The liquid photoreactive composition of claim 15, wherein component (a) and component (b) are present in a respective weight ratio of from 30:70 to 70:30, inclusive.

21. The liquid photoreactive composition of claim 15, wherein component (a) and component (b) are present in a respective weight ratio of from 35:65 to 65:35, inclusive.

22. The liquid photoreactive composition of claim 15, wherein component (a) and component (b) are present in a respective weight ratio of from 40:60 to 60:40, inclusive.

23. The liquid photoreactive composition of claim 15, wherein the at least one cationically polymerizable aliphatic epoxide having an epoxy group functionality of 2 comprises 3,4-epoxycyclohexylmethyl 3,4-epoxycyclohexylcarboxylate.

24. The liquid photoreactive composition of claim 15, wherein the at least one free-radically polymerizable compound having a free-radically polymerizable group functionality of 3 comprises trimethylolpropane triacrylate.

25. The liquid photoreactive composition of claim 15, wherein the aromatic onium salt comprises at least one of a diaryliodonium salt or a triarylsulfonium salt.

26. The liquid photoreactive composition of claim 15, wherein the two-photon sensitizer comprises 2,5-bis[4-(diphenylamino)stryl]-1-(2-ethylhexyloxy)-4-methoxybenzene.

\* \* \* \* \*

UNITED STATES PATENT AND TRADEMARK OFFICE
CERTIFICATE OF CORRECTION

PATENT NO. : 10,133,174 B2
APPLICATION NO. : 15/100577
DATED : November 20, 2018
INVENTOR(S) : Tzu-Chen Lee It is certified that error appears in the above-identified patent and that said Letters Patent is hereby corrected as shown below:

In the Specification

Column 3
Line 23, Delete "As used herein:" and insert the same on Column 3, Line 24 as a new paragraph.

Column 6
Line 3, After "timing" insert -- . --.

Column 10
Line 65, Delete "$I_{sam}$is" and insert -- $I_{sam}$ is --, therefor.

Column 11
Lines 20-31, Delete "Preferably, the two-photon absorption cross-section of the multiphoton absorber is greater than about 1.5 times that of fluorescein (or alternatively, greater than about $75 \times 10^{-50}$ cm$^4$sec/photon, as measured by the above method); more preferably, greater than about twice that of fluorescein (or, alternatively, greater than about $100 \times 10^{-50}$ cm$^4$sec/photon); more preferably, greater than about three times that of fluorescein (or, alternatively, greater than about $150 \times 10^{-50}$ cm$^4$sec/photon); and more preferably, greater than about four times that of fluorescein (or, alternatively, greater than about $200 \times 10^{-50}$ cm$^4$sec/photon)." and insert the same on Column 11, Line 21, as a new paragraph.

Column 20
Lines 34-35, Delete "dimethylaminobenzaldehyde,4-" and insert
-- dimethylaminobenzaldehyde, 4- --, therefor.

In the Claims

Column 27
Line 65, In Claim 1, before "disposing" insert -- (i) --.

Signed and Sealed this
Sixteenth Day of July, 2019

Andrei Iancu
*Director of the United States Patent and Trademark Office*

Column 30
Line 16, In Claim 23, delete "3 ,4-" and insert -- 3,4- --, therefor.